(12) United States Patent
Komuro et al.

(10) Patent No.: US 11,921,424 B2
(45) Date of Patent: Mar. 5, 2024

(54) PHOTOSENSITIVE RESIN COMPOSITION, DRY FILM USING SAME, PRINTED WIRING BOARD, AND PRINTED WIRING BOARD MANUFACTURING METHOD

(71) Applicant: Hitachi Chemical Company, Ltd., Tokyo (JP)

(72) Inventors: Nobuhito Komuro, Tokyo (JP); Yuta Daijima, Tokyo (JP); Masayuki Kojima, Tokyo (JP); Shinji Irizawa, Tokyo (JP); Shinya Oosaki, Tokyo (JP)

(73) Assignee: Hitachi Chemical Company, Ltd. (FIPAS), Tokyo (JP)

( * ) Notice: Subject to any disclaimer, the term of this patent is extended or adjusted under 35 U.S.C. 154(b) by 662 days.

(21) Appl. No.: 16/497,600

(22) PCT Filed: Mar. 30, 2017

(86) PCT No.: PCT/JP2017/013342
§ 371 (c)(1),
(2) Date: Sep. 25, 2019

(87) PCT Pub. No.: WO2018/179259
PCT Pub. Date: Oct. 4, 2018

(65) Prior Publication Data
US 2021/0109444 A1    Apr. 15, 2021

(51) Int. Cl.
*G03F 7/031*  (2006.01)
*G03F 7/029*  (2006.01)
(Continued)

(52) U.S. Cl.
CPC .............. *G03F 7/031* (2013.01); *G03F 7/029* (2013.01); *G03F 7/032* (2013.01); *G03F 7/0382* (2013.01); *G03F 7/40* (2013.01); *H05K 3/0076* (2013.01)

(58) Field of Classification Search
CPC ........ G03F 7/031; G03F 7/0382; G03F 7/032; G03F 7/40
See application file for complete search history.

(56) References Cited

U.S. PATENT DOCUMENTS

2011/0151379 A1    6/2011  Choi et al.
2012/0061128 A1*   3/2012  Ito ........................... C08G 8/30
                                                    430/287.1
(Continued)

FOREIGN PATENT DOCUMENTS

JP    2003198105 A    7/2003
JP    2011133851 A    7/2011
(Continued)

OTHER PUBLICATIONS

International Search Report for PCT/JP2017/013342 dated Jun. 27, 2017.
(Continued)

*Primary Examiner* — John S Chu
(74) *Attorney, Agent, or Firm* — Faegre Drinke Biddle & Reath, LLP

(57) ABSTRACT

There are provided a photosensitive resin composition which can be applied to either a projection exposure or direct-write exposure machine without fine adjustment of the composition, and can form a resist pattern having an excellent cross-sectional shape in which an undercut in which the bottom portion of the resist pattern is hollowed and omission of the top of the resist pattern are less likely to occur, and a line width of an intermediate portion (central portion) and a deepest portion (bottom portion) in the depth direction of the cross section of the resist pattern is less likely to be larger than a line width of the surface portion (that is, linearity in the depth direction of the resist pattern contour is favorable), and which has excellent insulation reliability and crack resistance reliability, and a dry film (Continued)

RESIST CROSS-SECTIONAL SHAPE: UNDERCUT

RESIST CROSS-SECTIONAL SHAPE: HEMMING (HALATION)

RESIST CROSS-SECTIONAL SHAPE: PROTRUSION (DIFFRACTION)

using the same, a printed wiring board, and a printed wiring board manufacturing method. The photosensitive resin composition includes an acid-modified vinyl group-containing epoxy resin (A), a photopolymerization initiator (B), a photopolymerization sensitizer including a benzophenone compound (C), and a photopolymerizable compound (D).

15 Claims, 1 Drawing Sheet

(51) Int. Cl.
*G03F 7/032* (2006.01)
*G03F 7/038* (2006.01)
*G03F 7/40* (2006.01)
*H05K 3/00* (2006.01)

(56) References Cited

U.S. PATENT DOCUMENTS

| | | | | |
|---|---|---|---|---|
| 2014/0186766 | A1* | 7/2014 | Higuchi | C08G 59/42 430/280.1 |
| 2014/0308613 | A1* | 10/2014 | Higuchi | H05K 3/287 525/531 |

FOREIGN PATENT DOCUMENTS

| | | |
|---|---|---|
| JP | 2013125138 A | 6/2013 |
| WO | WO-01079325 A1 | 10/2001 |
| WO | WO-2015016362 A1 | 2/2015 |

OTHER PUBLICATIONS

Written Opinion of the International Searching Authority for PCT/JP2017/013342 dated Jun. 27, 2017.

* cited by examiner

RESIST CROSS-SECTIONAL SHAPE: RECTANGLE

RESIST CROSS-SECTIONAL SHAPE: TRAPEZOID

RESIST CROSS-SECTIONAL SHAPE: UNDERCUT

RESIST CROSS-SECTIONAL SHAPE: HEMMING (HALATION)

RESIST CROSS-SECTIONAL SHAPE: PROTRUSION (DIFFRACTION)

PHOTOSENSITIVE RESIN COMPOSITION, DRY FILM USING SAME, PRINTED WIRING BOARD, AND PRINTED WIRING BOARD MANUFACTURING METHOD

CROSS-REFERENCE TO RELATED APPLICATIONS

This application is a national stage application (under 35 U.S.C, § 371) of PCT/JP2017/013342, filed Mar. 30, 2017, which is incorporated herein by reference in its entirety.

TECHNICAL FIELD

The present invention relates to a photosensitive resin composition, a dry film using the same, a printed wiring board, and a printed wiring board manufacturing method.

BACKGROUND ART

In the field of manufacturing a printed wiring board, a permanent mask resist is formed on a printed wiring board. The permanent mask resist has a function of preventing corrosion of a conductor layer and maintaining electrical insulation between conductor layers when the printed wiring board is used. In recent years, a permanent mask resist has had a function of a solder resist film that prevents solder from adhering to an unnecessary part of a conductor layer of a printed wiring board in a process of flip chip mounting, wire bonding mounting or the like of a semiconductor element on the printed wiring board via solder.

In the related art, the permanent mask resist in the printed wiring board manufacture is produced according to screen printing using a thermosetting resin composition or a photographic method using a photosensitive resin composition. For example, in a flexible wiring board using a mounting method such as flip chip (FC), tape automated bonding (TAB), and chip on film (COF), except for IC chips, electronic components, or liquid crystal display (LCD) panels, and connection wiring parts, a thermosetting resin paste is subjected to screen printing, and thermally cured to form a permanent mask resist (for example, refer to Patent Literature 1).

In addition, in semiconductor package substrates such as ball grid arrays (BGA) and chip size packages (CSP) mounted in electronic components, in order to (1) flip chip mount a semiconductor element on a semiconductor package substrate via solder, in order to (2) bond a semiconductor element and a semiconductor package substrate by wire bonding, or in order to (3) bond a semiconductor package substrate to a motherboard substrate via solder, it is necessary to remove the permanent mask resist at the bonding part.

Therefore, the permanent mask resist is formed using a photographic method in which a photosensitive resin composition is applied and dried and active light such as ultraviolet rays is then selectively emitted for curing, only an unexposed part being developed and removed to form an image. Since the photographic method is suitable for mass production due to its favorable workability, it is widely used for image formation of a photosensitive resin composition in the electronic material industries (for example, refer to Patent Literature 2). Regarding an exposure machine used for emission, a mask non-contact type projection exposure machine and a direct-write exposure machine without a mask are widely known.

CITATION LIST

Patent Literature

Patent Literature 1: JP 2003-198105 A
Patent Literature 2: JP 2011-133851 A

SUMMARY OF INVENTION

Technical Problem

However, wavelengths for exposure to be emitted differ depending on a difference of exposure lamps, and it is difficult to emit light with the same composition. For example, if the composition is matched to a projection exposure machine having a main emission peak on the low wavelength side, an exposure time should be increased in a direct-write exposure machine having a main emission peak on the long wavelength side, and thus productivity deteriorates. Therefore, currently, the composition needs to be finely adjusted according to respective exposure machines.

In addition, in recent years, along with reduction in size and higher performance of electronic devices, the size of a hole diameter (opening diameter) of a permanent mask resist and a distance between centers of holes have tended to become smaller, and for example, fine patterns in which the size of the hole diameter is 100 μm and a distance between centers of holes is 100 μm, and the size of the hole diameter is 80 μm and a distance between centers of holes is 80 μm are used. For example, in flip chip mounting, recently, in addition to the resolution, improved insulation reliability and crack resistance reliability have been required for photosensitive resin compositions.

An aim of the present invention is to provide a photosensitive resin composition which can be applied to either a projection exposure or direct-write exposure machine without fine adjustment of the composition, and can form a resist pattern having an excellent cross-sectional shape in which an undercut in which the bottom portion of the resist pattern is hollowed and omission of the top of the resist pattern are less likely to occur, and a line width of an intermediate portion (central portion) and a deepest portion (bottom portion) in the depth direction of the cross section of the resist pattern is less likely to be larger than a line width of the surface portion (that is, linearity in the depth direction of the resist pattern contour (edge) is favorable), and which has excellent insulation reliability and crack resistance reliability, and a dry film using the same, a printed wiring board, and a printed wiring board manufacturing method.

Solution to Problem

In order to address the above problems, the inventors conducted extensive studies and as a result, found that these problems can be addressed when a benzophenone compound as a photopolymerization sensitizer is additionally added to a composition including an acid-modified vinyl group-containing epoxy resin, a photopolymerization initiator and a photopolymerizable compound, and thereby completed the present invention. Specifically, the present invention provides the following photosensitive resin composition, dry film using the same, printed wiring board, and printed wiring board manufacturing method.

[1] A photosensitive resin composition including: an acid-modified vinyl group-containing epoxy resin (A); a photopolymerization initiator (B); a photopolymerization sensitizer containing a benzophenone compound (C); and a photopolymerizable compound (D).

[2] The photosensitive resin composition according to [1], in which the benzophenone compound contained in the component (C) is a benzophenone compound having at least one group selected from the group consisting of an amino group, an ethylamino group, a dimethylamino group, a diethylamino group, a dibutylamino group, a hydroxyl group, a methoxy group, an ethoxy group, a butoxy group, and a phenyl group.

[3] The photosensitive resin composition according to [1] or [2], in which the component (A) includes at least one selected from the group consisting of at least one acid-modified vinyl group-containing epoxy resin (A1) synthesized using a bisphenol novolak type epoxy resin (a1) and at least one acid-modified vinyl group-containing epoxy resin (A2) synthesized using an epoxy resin (a2) different from the epoxy resin (a1).

[4] The photosensitive resin composition according to [3], in which the epoxy resin (a2) is at least one selected from the group consisting of a novolak type epoxy resin, a bisphenol A type epoxy resin, a bisphenol F type epoxy resin, and a triphenolmethane type epoxy resin.

[5] The photosensitive resin composition according to [3] or [4], in which the acid-modified vinyl group-containing epoxy resin (A1) is a resin obtained by reacting a resin (A1') obtained by reacting the epoxy resin (a1) with a vinyl group-containing monocarboxylic acid (b) with a saturated or unsaturated group-containing polybasic acid anhydride (c), and the acid-modified vinyl group-containing epoxy resin (A2) is a resin obtained by reacting a resin (A2') obtained by reacting each of the epoxy resins (a2) with a vinyl group-containing monocarboxylic acid (b) with a saturated or unsaturated group-containing polybasic acid anhydride (c).

[6] The photosensitive resin composition according to any one of [3] to [5], in which the bisphenol novolak type epoxy resin (a1) is at least one selected from the group consisting of bisphenol novolak type epoxy resins having a structural unit represented by the following General Formula (I) and bisphenol novolak type epoxy resins having a structural unit represented by the following General Formula (II):

[Chem. 1]

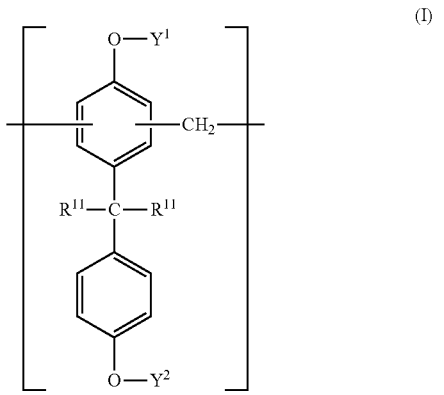

(I)

[in General Formula (I), $R^{11}$ represents a hydrogen atom or a methyl group, $Y^1$ and $Y^2$ each independently represent a hydrogen atom or a glycidyl group, a plurality of $R^{11}$'s may be the same as or different from each other, and at least one of $Y^1$ and $Y^2$ represents a glycidyl group]

[Chem. 2]

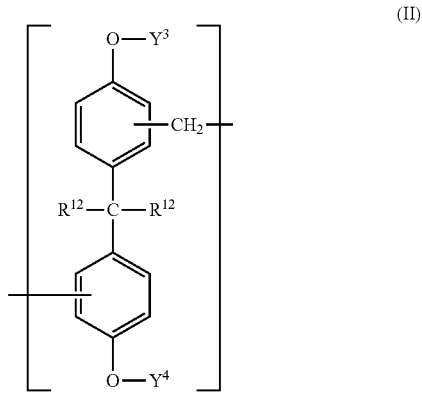

(II)

[in General Formula (II), $R^{12}$ represents a hydrogen atom or a methyl group, $Y^3$ and $Y^4$ each independently represent a hydrogen atom or a glycidyl group, a plurality of $R^{12}$'s may be the same as or different from each other, and at least one of $Y^3$ and $Y^4$ represents a glycidyl group], and the epoxy resin (a2) is at least one selected from the group consisting of a novolak type epoxy resin having a structural unit represented by the following General Formula (III), a bisphenol type epoxy resin having a structural unit represented by the following General Formula (IV), and a triphenolmethane type epoxy resin having a structural unit represented by the following General Formula (V):

[Chem. 3]

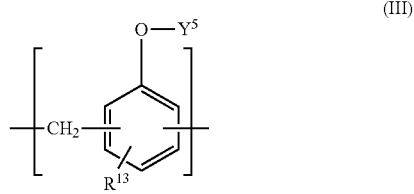

(III)

[in General Formula (III), $R^{13}$ represents a hydrogen atom or a methyl group, $Y^5$ represents a hydrogen atom or a glycidyl group, and a molar ratio between hydrogen atoms and glycidyl groups (hydrogen atoms/glycidyl groups) is 0/100 to 30/70]

[Chem. 4]

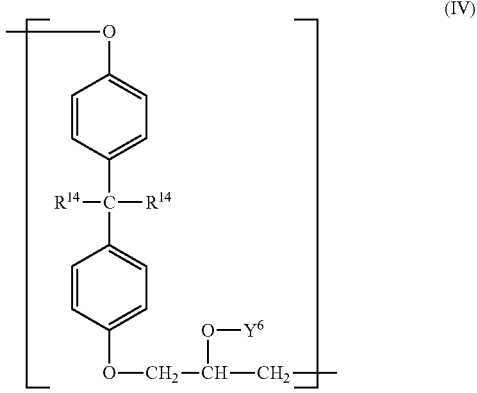

(IV)

[in General Formula (IV), $R^{14}$ represents a hydrogen atom or a methyl group, $Y^6$ represents a hydrogen atom or a glycidyl group, a molar ratio between hydrogen atoms and glycidyl groups (hydrogen atoms/glycidyl groups) is 0/100 to 30/70, and a plurality of $R^{14}$'s may be the same as or different from each other]

[Chem. 5]

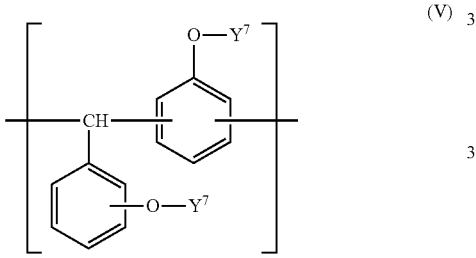

(V)

[in General Formula (V), $Y^7$ represents a hydrogen atom or a glycidyl group, a plurality of $Y^7$'s may be the same as or different from each other, and at least one $Y^7$ is a glycidyl group].

[7] The photosensitive resin composition according to any one of [3] to [6], in which the component (A) includes at least one of the acid-modified vinyl group-containing epoxy resins (A1) and at least one of the acid-modified vinyl group-containing epoxy resins (A2).

[8] The photosensitive resin composition according to [7], in which the bisphenol novolak type epoxy resin (a1) has a structural unit represented by General Formula (I) and the epoxy resin (a2) is a bisphenol A type epoxy resin or bisphenol F type epoxy resin having a structural unit represented by General Formula (IV).

[9] The photosensitive resin composition according to any one of [3] to [6], in which the component (A) includes at least one of the acid-modified vinyl group-containing epoxy resins (A2).

[10] The photosensitive resin composition according to [9], in which the epoxy resin (a2) is a novolak type epoxy resin having a structural unit represented by General Formula (III).

[11] The photosensitive resin composition according to any one of [1] to [10], in which the photopolymerization initiator (B) is at least one selected from the group consisting of an alkylphenone photopolymerization initiator, an acylphosphine oxide photopolymerization initiator, a titanocene photopolymerization initiator, and an oxime ester photopolymerization initiator.

[12] The photosensitive resin composition according to any one of [1] to [11], in which the photopolymerization initiator (B) is at least one selected from the group consisting of an alkylphenone photopolymerization initiator, an acylphosphine oxide photopolymerization initiator, and an oxime ester photopolymerization initiator.

[13] The photosensitive resin composition according to any one of [1] to [12], in which the photopolymerization initiator (B) is an acylphosphine oxide photopolymerization initiator.

[14] The photosensitive resin composition according to any one of [1] to [13], further including a pigment (E).

[15] The photosensitive resin composition according to any one of [1] to [14], further including an inorganic filler (F).

[16] A dry film including: a carrier film; and a photosensitive layer using the photosensitive resin composition according to any one of [1] to [15].

[17] A printed wiring board including a permanent mask resist formed of the photosensitive resin composition according to any one of [1] to [15].

[18] The printed wiring board according to [17], in which the thickness of the permanent mask resist is 10 μm or more.

[19] A printed wiring board manufacturing method, including: a process of providing a photosensitive layer on a substrate using the photosensitive resin composition according to any one of [1] to [15] or the dry film according to [16]; a process of forming a resist pattern using the photosensitive layer; and a process of curing the resist pattern to form a permanent mask resist, in this order.

Advantageous Effects of Invention

According to the present invention, it is possible to provide a photosensitive resin composition which can be applied to either a projection exposure or direct-write exposure machine without fine adjustment of the composition, and can form a resist pattern having an excellent cross-sectional shape in which an undercut in which the bottom portion of the resist pattern is hollowed and omission of the top of the resist pattern are less likely to occur, and a line width of an intermediate portion (central portion) and a deepest portion (bottom portion) in the depth direction of the cross section of the resist pattern is less likely to be larger than a line width of the surface portion (that is, linearity in the depth direction of the resist pattern contour is favorable), and linearity in the depth direction of the resist pattern contour is favorable, and which has excellent adhesion with respect to a copper substrate and fluidity, and a dry film using the same, a printed wiring board, and a printed wiring board manufacturing method.

DESCRIPTION OF EMBODIMENTS

[Photosensitive Resin Composition]

Figure 1:
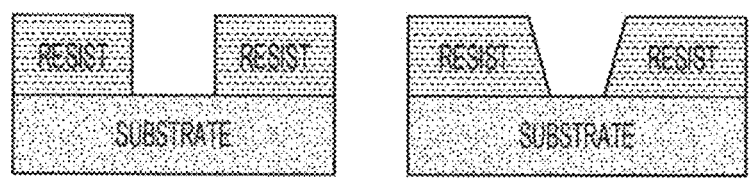
FIG. 1 is a schematic view showing a resist cross-sectional shape having excellent linearity in the depth direction of a resist pattern contour.

A photosensitive resin composition according to an embodiment (hereinafter simply referred to as the present embodiment in some cases) of the present invention includes an acid-modified vinyl group-containing epoxy resin (A), a photopolymerization initiator (B), a photopolymerization sensitizer containing a benzophenone compound (C), and a photopolymerizable compound (D). In this specification, these components may be simply referred to as a component (A), a component (B), a component (C), a component (D), and the like. When the photosensitive resin composition of the present embodiment has the above configuration, since it is possible to improve photocurability of the bottom portion of a resist pattern, an undercut in which the bottom portion of the resist pattern is hollowed and omission of the top of the resist pattern are less likely to occur, and it is not necessary to increase an exposure amount of ultraviolet emission. Therefore, it is thought that a thick resist pattern having excellent linearity in the depth direction of the resist pattern contour can be formed. In addition, when the photosensitive resin composition of the present embodiment has the above specific configuration, it has excellent adhesion with respect to a copper substrate and excellent fluidity. In addition, it is considered that basic properties such as electrical insulation, solder heat resistance, thermal shock resistance, solvent resistance, acid resistance, and alkali resistance required for a photosensitive resin composition used for manufacturing a printed wiring board are also excellent.

The components will be described below.

<Acid-Modified Vinyl Group-Containing Epoxy Resin (A)>

The photosensitive resin composition of the present embodiment includes the component (A). The component (A) is an epoxy resin modified with a vinyl group-containing organic acid, and examples thereof include an epoxy resin obtained by reacting a resin obtained by reacting an epoxy resin with a vinyl group-containing monocarboxylic acid with a polybasic acid anhydride containing a saturated group or unsaturated group.

Examples of the component (A) include an acid-modified vinyl group-containing epoxy resin (A1) (hereinafter referred to as a component (A1) in some cases) synthesized using a bisphenol novolak type epoxy resin (a1)(hereinafter referred to as a component (a1) in some cases), and an acid-modified vinyl group-containing epoxy resin (A2) (hereinafter referred to as a component (A2) in some cases) synthesized using an epoxy resin (a2) (hereinafter referred to as a component (a2) in some cases) other than the epoxy resin (a1), and these can be used alone or a plurality of types thereof can be used in combination. In addition, in order to prevent the occurrence of an undercut and omission of the top of the resist, and in order to improve linearity in the depth direction of the resist pattern contour, adhesion with respect to a copper substrate, and fluidity, the component (A) may include at least one component (A1) synthesized using the component (a1) and at least one component (A2) synthesized using the component (a2).

(Epoxy Resin (a1))

Regarding the component (A), in order to prevent the occurrence of an undercut and omission of the top of the resist and in order to improve linearity in the depth direction of the resist pattern contour, adhesion with respect to a copper substrate, and fluidity, and also in order to reduce warpage (warpage reduction) of a thin film substrate and improve the thermal shock resistance and resolution, the component (A1) synthesized using the component (a1) is preferably included. In the same regard, regarding the component (a1), a bisphenol novolak type epoxy resin having a structural unit represented by the following General Formula (I) or (II) is preferable, and a bisphenol novolak type epoxy resin having a structural unit represented by General Formula (II) is more preferable.

[Epoxy Resin Having a Structural Unit Represented by General Formula (I)]

One preferable aspect of the component (a1) is an epoxy resin having a structural unit represented by the following General Formula (I).

[Chem. 6]

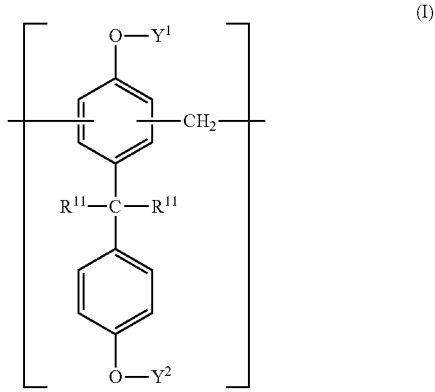

In General Formula (I), $R^{11}$ represents a hydrogen atom or a methyl group, $Y^1$ and $Y^2$ each independently represent a hydrogen atom or a glycidyl group, a plurality of $R^{11}$'s may be the same as or different from each other, and at least one of $Y^1$ and $Y^2$ represents a glycidyl group.

In order to prevent the occurrence of an undercut and omission of the top of the resist and in order to improve the linearity in the depth direction of the resist pattern contour and the resolution, $R^{11}$ is preferably a hydrogen atom. In addition, in the same regard, in order to also improve the thermal shock resistance and warpage reduction, $Y^1$ and $Y^2$ are preferably a glycidyl group.

The number of structural units in one molecule of the component (a1) having a structural unit represented by General Formula (I) is a number of 1 or more, and may be preferably appropriately selected from among 10 to 100, 15 to 80, and 15 to 70. When the number of structural units is within the above range, a resist shape having improved linearity in the depth direction of the resist pattern contour can be formed, and the adhesion with respect to a copper substrate, heat resistance, and electrical insulation are improved. Here, the number of structural units indicates an integer value when the component (a1) is composed of a single type of molecule and indicates a rational number which is an average value when the component (a1) is an aggregate of molecules of a plurality of types.

Hereinafter, this similarly applies to the number of structural units.

[Epoxy Resin Having a Structural Unit Represented by General Formula (II)]

Further, one of other preferable aspects of the component (a1) is an epoxy resin having a structural unit represented by the following General Formula (II).

[Chem. 7]

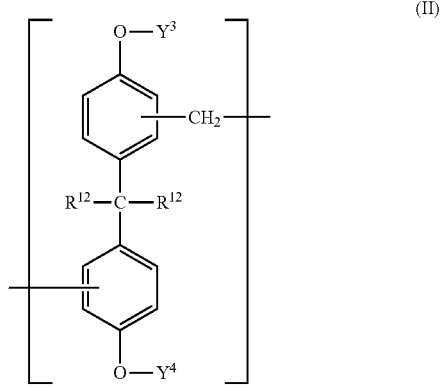

(II)

In General Formula (II), $R^{12}$ represents a hydrogen atom or a methyl group, $Y^3$ and $Y^4$ each independently represent a hydrogen atom or a glycidyl group, a plurality of $R^{12}$'s may be the same as or different from each other, and at least one of $Y^3$ and $Y^4$ represents a glycidyl group.

In order to prevent the occurrence of an undercut and omission of the top of the resist and in order to improve the linearity in the depth direction of the resist pattern contour and the resolution, $R^{12}$ is preferably a hydrogen atom. In addition, in the same regard, in order to also improve the thermal shock resistance and warpage reduction, $Y^3$ and $Y^4$ are preferably a glycidyl group.

The number of structural units in one molecule of the component (a1) having a structural unit represented by General Formula (II) is a number of 1 or more, and may be preferably appropriately selected from among 10 to 100, 15 to 80, and 15 to 70. When the number of structural units is within the above range, a resist shape having improved linearity in the depth direction of the resist pattern contour can be formed, and the adhesion with respect to a copper substrate, heat resistance, and electrical insulation are improved.

For example, EXA-7376 series (product name, commercially available from DIC Corporation) are commercially available as an epoxy resin in which, in General Formula (II), $R^{12}$ is a hydrogen atom, and $Y^3$ and $Y^4$ are a glycidyl group, and EPON SU8 series (product name, commercially available from Japan Epoxy Resin Co., Ltd.) are commercially available as an epoxy resin in which, in General Formula (II), $R^{12}$ is a methyl group, and $Y^3$ and $Y^4$ are a glycidyl group.

(Epoxy Resin (a2))

The component (a2) is not particularly limited as long as it is an epoxy resin different from the component (a1), but in order to prevent the occurrence of an undercut and omission of the top of the resist, in order to improve linearity in the depth direction of the resist pattern contour, adhesion with respect to a copper substrate, and fluidity, and in order to improve the resolution, at least one selected from the group consisting of a novolak type epoxy resin, a bisphenol A type epoxy resin, a bisphenol F type epoxy resin, and a triphenolmethane type epoxy resin is preferable. Preferable examples of novolak type epoxy resins include those having the following structural unit represented by General Formula (III), preferable examples of bisphenol A type epoxy resins or bisphenol F type epoxy resins include those having a structural unit represented by the following General Formula (IV), and preferable examples of triphenolmethane type epoxy resins include those having a structural unit represented by the following General Formula (V).

The component (a2) is more preferably at least one selected from the group consisting of a novolak type epoxy resin having a structural unit represented by General Formula (III) and a bisphenol A type epoxy resin and bisphenol F type epoxy resin having a structural unit represented by General Formula (IV), and regarding the resin having a structural unit represented by General Formula (IV), a bisphenol F type epoxy resin is preferable. In addition, in order to achieve both photosensitive properties and insulation reliability, without using the component (A1) formed using the component (a1), the component (a2) is preferably the novolak type epoxy resin having a structural unit represented by General Formula (III). In addition, in order to improve the thermal shock resistance, warpage reduction, and resolution, a combination in which the component (A) includes the component (A1) and the component (A2), and particular, the component (a1) is a bisphenol novolak type epoxy resin having a structural unit represented by General Formula (II) and the component (a2) is a bisphenol A type epoxy resin or bisphenol F type epoxy resin having a structural unit represented by General Formula (IV) is particularly preferable. Here, "without using the component (A1)" means that it is not substantially included, and the content of the component (A1) is less than 5 mass %, less than 1 mass % or less than 0.5 mass % in the total solid content of the component (A).

[Epoxy Resin Having a Structural Unit Represented by General Formula (III)]

Preferable examples of the component (a2) include a novolak type epoxy resin having a structural unit represented by the following General Formula (III), and examples of novolak type epoxy resins having such a structural unit include a novolak type epoxy resin represented by the following General Formula (III').

[Chem. 8]

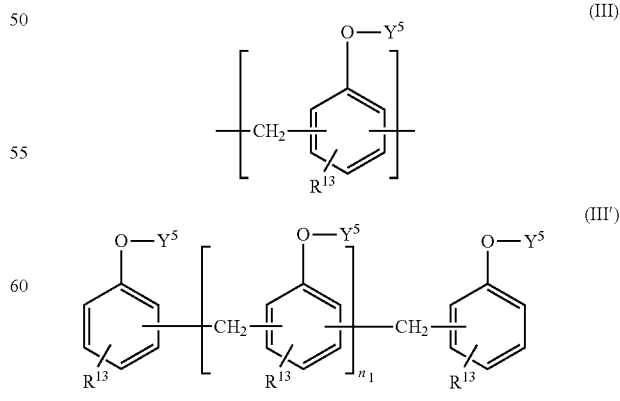

In General Formulae (III) and (III'), $R^{13}$ represents a hydrogen atom or a methyl group, $Y^5$ represents a hydrogen atom or a glycidyl group, and a molar ratio between hydrogen atoms and glycidyl groups (hydrogen atoms/glycidyl groups) is 0/100 to 30/70. In addition, in General Formula (III'), $n_1$ is a number of 1 or more, and a plurality of $R^{13}$'s and $Y^5$'s may be the same as or different from each other, and at least one $Y^5$ is a glycidyl group.

In order to prevent the occurrence of an undercut and omission of the top of the resist and in order to improve the linearity in the depth direction of the resist pattern contour and the resolution, $R^{13}$ is preferably a hydrogen atom.

In addition, in the component (a2) having a structural unit represented by General Formula (III) and in the component (a2) represented by General Formula (III'), a molar ratio between hydrogen atoms $Y^5$ and glycidyl groups $Y^5$ (hydrogen atoms/glycidyl groups) is 0/100 to 30/70, and preferably 0/100 to 10/90 in order to prevent the occurrence of an undercut and omission of the top of the resist and in order to improve the linearity in the depth direction of the resist pattern contour and the resolution. As can be understood from this molar ratio, at least one $Y^5$ is a glycidyl group.

The number of structural units in one molecule of the component (a2) having a structural unit represented by General Formula (III) and the number indicated by $n_1$ in General Formula (III') are a number of 1 or more, and may be preferably appropriately selected from among 10 to 200, 30 to 150, and 30 to 100. When $n_1$ is within the above range, a resist shape having improved linearity in the depth direction of the resist pattern contour can be formed, and the adhesion with respect to a copper substrate, heat resistance, and electrical insulation are improved.

Examples of novolak type epoxy resins represented by General Formula (III) include a phenol novolak type epoxy resin and a cresol novolak type epoxy resin. Such a novolak type epoxy resin can be obtained by, for example, reacting a phenol novolak resin and a cresol novolak resin with an epichlorohydrin according to a known method.

Regarding the phenol novolak type epoxy resin or cresol novolak type epoxy resin represented by General Formula (III'), for example, YDCN-701, YDCN-702, YDCN-703, YDCN-704, YDCN-704L, YDPN-638, and YDPN-602 (product name, all commercially available from Nippon Steel Chemical & Material), CEN-431, and CEN-439 (product name, all commercially available from Dow Chemical Co., Ltd.), EOCN-120, EOCN-102S, EOCN-103S, EOCN-104S, EOCN-1012, EOCN-1025, EOCN-1027, and BREN (product name, all commercially available from Nippon Kayaku Co., Ltd.), EPN-1138, EPN-1235, and EPN-1299 (product name, all commercially available from BASF), N-730, N-770, N-865, N-665, N-673, VH-4150, and VH-4240 (product name, all commercially available from DIC Corporation) and the like are commercially available.

[Epoxy Resin Having a Structural Unit Represented by General Formula (IV)]

In addition, preferable examples of the component (a2) include a bisphenol A type epoxy resin or bisphenol F type epoxy resin having a structural unit represented by the following General Formula (IV), and examples of epoxy resins having such a structural unit include a bisphenol A type epoxy resin or bisphenol F type epoxy resin represented by General Formula (IV').

[Chem. 9]

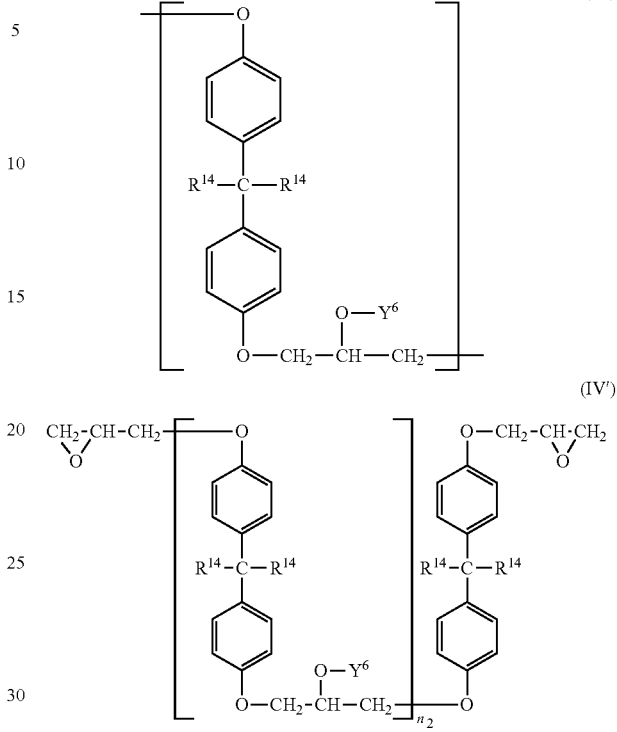

In General Formulae (IV) and (IV'), $R^{14}$ represents a hydrogen atom or a methyl group, $Y^6$ represents a hydrogen atom or a glycidyl group, and a molar ratio between hydrogen atoms and glycidyl groups (hydrogen atoms/glycidyl groups) is 0/100 to 30/70. In addition, a plurality of $R^{14}$'s may be the same as or different from each other, and in General Formula (IV'), $n_2$ is a number of 1 or more, and when $n_2$ is 2 or more, a plurality of $Y^6$'s may be the same as or different from each other, and at least one $Y^6$ is a glycidyl group.

In order to prevent the occurrence of an undercut and omission of the top of the resist and in order to improve the linearity in the depth direction of the resist pattern contour and the resolution, $R^{14}$ is preferably a hydrogen atom. In addition, in the same regard, in order to also improve the thermal shock resistance and warpage reduction, $Y^6$ is preferably a glycidyl group.

In addition, in the component (a2) having a structural unit represented by General Formula (IV) and in the component (a2) represented by General Formula (IV'), a molar ratio between hydrogen atoms $Y^6$ and glycidyl groups $Y^6$ (hydrogen atoms/glycidyl groups) is 0/100 to 30/70 and preferably 0/100 to 10/90 in order to improve the thermal shock resistance and low warpage. In General Formula (IV), at least one $Y^6$ is preferably a glycidyl group.

The number of structural units in one molecule of the component (a2) having a structural unit represented by General Formula (IV) and the number indicated by $n_2$ in General Formula (IV') are a number of 1 or more, and may be preferably appropriately selected from among 10 to 100, 10 to 80, and 15 to 60. When $n_2$ is within the above range, a resist shape having improved linearity in the depth direction of the resist pattern contour can be formed, and the adhesion with respect to a copper substrate, heat resistance, and electrical insulation are improved.

A bisphenol A type epoxy resin or bisphenol F type epoxy resin which is represented by General Formula (IV') and in which $Y^6$ is a glycidyl group can be obtained by, for example, reacting a hydroxyl group of a bisphenol A type epoxy resin or bisphenol F type epoxy resin represented by the following General Formula (IV'') with an epichlorohydrin.

[Chem. 10]

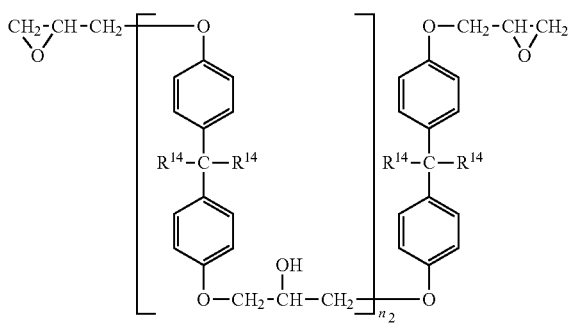

(IV'')

In General Formula (IV''), $R^{14}$ and $n_2$ have the same meanings as above.

In order to promote the reaction between the hydroxyl group and epichlorohydrin, the reaction is preferably carried out in a polar organic solvent such as dimethylformamide, dimethylacetamide, and dimethyl sulfoxide in the presence of an alkali metal hydroxide at a reaction temperature of 50 to 120° C. When the reaction temperature is within the above range, side reactions can be reduced without making the reaction become slow.

Regarding the bisphenol A type epoxy resin or bisphenol F type epoxy resin represented by General Formula (IV'), for example, Epikote 807, 815, 825, 827, 828, 834, 1001, 1004, 1007 and 1009 (product name, all commercially available from Japan Epoxy Resin Co., Ltd.), DER-330, DER-301, and DER-361 (product name, all commercially available from Dow Chemical Co., Ltd.), YD-8125, YDF-170, YDF-175S, YDF-2001, YDF-2004, and YDF-8170 (product name, all commercially available from Nippon Steel Chemical & Material) and the like are commercially available.

[Epoxy Resin Having a Structural Unit Represented by General Formula (V)]

In addition, preferable examples of the component (a2) include a triphenolmethane type epoxy resin having a structural unit represented by the following General Formula (V), and preferable examples of triphenolmethane type epoxy resins having such a structural unit include a triphenolmethane type epoxy resin represented by General Formula (V').

[Chem. 11]

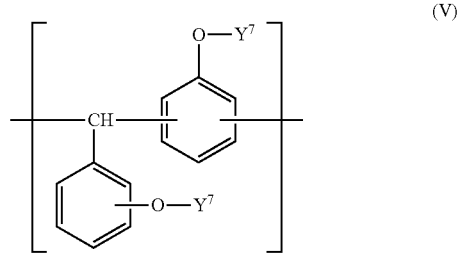

(V)

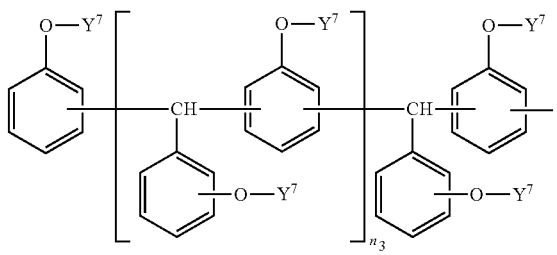

(V')

In General Formulae (V) and (V'), $Y^7$ represents a hydrogen atom or a glycidyl group, a plurality of $Y^7$'s may be the same as or different from each other, and at least one $Y^7$ is a glycidyl group. In addition, in General Formula (V'), $n_3$ is a number of 1 or more.

In the component (a2) having a structural unit represented by General Formula (V) and in the component (a2) represented by General Formula (V'), a molar ratio between hydrogen atoms $Y^7$ and glycidyl groups $Y^7$ (hydrogen atoms/glycidyl groups) is preferably 0/100 to 30/70, and appropriately selected within the above range in order to prevent the occurrence of an undercut and omission from the top of the resist and in order to improve the linearity in the depth direction of the resist pattern contour and the resolution. As can be understood from this molar ratio, at least one $Y^7$ is a glycidyl group.

The number of structural units in one molecule of the component (a2) having a structural unit represented by General Formula (IV) and the number indicated by $n_3$ in General Formula (V') are a number of 1 or more, and may be preferably appropriately selected from among 10 to 100, 15 to 80, and 15 to 70. When $n_3$ is within the above range, a resist shape having improved linearity in the depth direction of the resist pattern contour can be formed, and the adhesion with respect to a copper substrate, heat resistance and electrical insulation are improved.

Regarding the triphenolmethane type epoxy resin represented by General Formula (V'), for example, FAE-2500, EPPN-501H, and EPPN-502H (product name, all commercially available from Nippon Kayaku Co., Ltd.) and the like are commercially available.

In order to improve the linearity in the depth direction of the resist pattern contour and the resolution, the component (A1) and the component (A2) are preferably resins obtained by reacting resins (A1') and (A2') (hereinafter both are referred to as a "component (A')" in some cases) obtained by reacting the component (a1) and the component (a2) (hereinafter referred to as a "component (a)" in some cases) with a vinyl group-containing monocarboxylic acid (b) (hereinafter referred to as a component (b) in some cases) with a saturated or unsaturated group-containing polybasic acid anhydride (c) (hereinafter referred to as a component (c) in some cases).

[Vinyl Group-Containing Monocarboxylic Acid (b)]

Preferable examples of the component (b) include acrylic acid derivatives such as acrylic acid, an acrylic acid dimer, methacrylic acid, β-furfurylacrylic acid, β-styrylacrylic acid, cinnamic acid, crotonic acid, and α-cyanocinnamic acid, a half-ester compound which is a reaction product of a hydroxyl group-containing acrylate and a dibasic acid anhydride, and a half-ester compound which is a reaction product of a vinyl group-containing monoglycidyl ether or a vinyl group-containing monoglycidyl ester and a dibasic acid anhydride.

The half-ester compound can be obtained by, for example, reacting a hydroxyl group-containing acrylate, a vinyl group-containing monoglycidyl ether or a vinyl group-containing monoglycidyl ester with a dibasic acid anhydride in an equal molar ratio. These components (b) can be used alone or a plurality of types thereof can be used in combination.

Examples of hydroxyl group-containing acrylates, vinyl group-containing monoglycidyl ethers, and vinyl group-containing monoglycidyl esters used for synthesizing the above half-ester compound which is an example of the component (b) include hydroxyethyl acrylate, hydroxyethyl methacrylate, hydroxypropyl acrylate, hydroxypropyl methacrylate, hydroxybutyl acrylate, hydroxybutyl methacrylate, polyethylene glycol monoacrylate, polyethylene glycol monomethacrylate, trimethylolpropane diacrylate, trimethylolpropane dimethacrylate, pentaerythritol triacrylate, pentaerythritol trimethacrylate, dipentaerythritol pentaacrylate, pentaerythritol pentamethacrylate, glycidyl acrylate, and glycidyl methacrylate.

Examples of dibasic acid anhydrides used for synthesizing the above half-ester compound include those containing a saturated group and those containing an unsaturated group. Specific examples of dibasic acid anhydrides include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

In the reaction between the component (a) and the component (b), the component (b) is preferably reacted at a ratio of 0.5 to 1.5 equivalents, more preferably reacted at a ratio of 0.6 to 1.05 equivalents, and most preferably reacted at a ratio of 0.8 to 1.0 equivalent with respect to 1 equivalent of the epoxy group of the component (a). When the reaction is performed at such a ratio, since the photopolymerizability is improved, that is, the light sensitivity increases, the linearity in the depth direction of the resist pattern contour is improved.

The component (a) and the component (b) can be dissolved and reacted in an organic solvent. Preferable examples of organic solvents include ketones such as methyl ethyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum solvents such as petroleum ether, oil naphtha, hydrogenated naphtha, and solvent naphtha.

In addition, in order to promote the reaction between the component (a) and the component (b), a catalyst is preferably used. Examples of catalysts include triethylamine, benzylmethylamine, methyltriethylammonium chloride, benzyltrimethylammonium chloride, benzyltrimethylammonium bromide, benzyltrimethylammonium iodide, and triphenylphosphine. An amount of the catalyst used may be appropriately selected, and is preferably 0.01 to 10 parts by mass, more preferably 0.05 to 2 parts by mass, and most preferably 0.1 to 1 part by mass with respect to a total of 100 parts by mass of the component (a) and the component (b).

With the above amount used, the reaction between the component (a) and the component (b) is promoted.

In addition, in order to prevent polymerization during the reaction, a polymerization inhibitor is preferably used. Examples of polymerization inhibitors include hydroquinone, methylhydroquinone, hydroquinone monomethyl ether, catechol, and pyrogallol. In order to improve storage stability of the composition, an amount of the polymerization inhibitor used may be appropriately selected, and is preferably 0.01 to 1 part by mass, more preferably 0.02 to 0.8 parts by mass, and most preferably 0.04 to 0.5 parts by mass with respect to a total of 100 parts by mass of the component (a) and the component (b).

The reaction temperature for the component (a) and the component (b) may be appropriately selected and is preferably in a range of 60 to 150° C., more preferably in a range of 80 to 120° C., and most preferably in a range of 90 to 110° C. in consideration of productivity.

Thus, the component (A') obtained by reacting the component (a) with the component (b) is thought to have a hydroxyl group formed by a ring-opening addition reaction between an epoxy group of the component (a) and a carboxyl group of the component (b). It is thought that the component (A') obtained above is additionally reacted with the component (c) having a saturated or unsaturated group to form an acid-modified vinyl group-containing epoxy resin in which a hydroxyl group (including also a hydroxyl group that is originally present in the component (a)) of the component (A') and an acid anhydride group of the component (c) are half-esterified.

[Polybasic Acid Anhydride (c)]

Regarding the component (c), those containing a saturated group and those containing an unsaturated group can be used. Specific examples of the component (c) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Among these, tetrahydrophthalic anhydride is preferable in order to obtain a photosensitive resin composition that can form a pattern with an excellent resolution.

In the reaction between the component (A') and the component (c), for example, when 0.1 to 1.0 equivalent of the component (c) is reacted with respect to 1 equivalent of the hydroxyl group of the component (A'), it is possible to adjust an acid value of the acid-modified vinyl group-containing epoxy resin.

The acid value of the component (A) is preferably 30 to 150 mg KOH/g, more preferably 40 to 120 mg KOH/g, and most preferably 50 to 100 mg KOH/g. When the acid value is 30 mg KOH/g or more, the photosensitive resin composition has excellent solubility in a dilute alkaline solution, and when the acid value is 150 mg KOH/g or less, electrical properties of the cured film are improved.

The reaction temperature for the component (A') and the component (c) may be appropriately selected and is preferably in a range of 50 to 150° C., more preferably in a range of 60 to 120° C., and most preferably in a range of 70 to 100° C. in consideration of productivity.

In addition, as necessary, regarding the component (a), for example, a part of a hydrogenated bisphenol A type epoxy resin can be used together. In addition, regarding the component (A), a part of a styrene-maleic acid resin such as a hydroxyethyl(meth)acrylate modified product of a styrene-maleic anhydride copolymer can be used together.

(Molecular Weight of Component (A))

The weight average molecular weight of the component (A) is preferably 3,000 to 150,000, more preferably 3,000 to 30,000, still more preferably 4,000 to 25,000, and particularly preferably 5,000 to 18,000. Within the above range, a resist shape having improved linearity in the depth direction of the resist pattern contour can be formed, and the adhesion with respect to a copper substrate, heat resistance, and electrical insulation are improved. Here, the weight average molecular weight is a weight average molecular weight in terms of polyethylene measured according to a gel permeation chromatographic (GPC) method using tetrahydrofuran as a solvent. More specifically, for example, a value measured using the following GPC measurement device and measurement conditions and converted using a standard polystyrene calibration curve can be used as a weight average molecular weight. In addition, the calibration curve is created using 5 sample sets ("PStQuick MP-H" and "PStQuick B," commercially available from Tosoh Corporation) as the standard polystyrene.

(GPC Measurement Device)

GPC device: high-speed GPC device "HCL-8320GPC," detector is a differential refractometer or UV, commercially available from Tosoh Corporation Column: column TSKgel SuperMultipore HZ-H (column length: 15 cm, column inner diameter: 4.6 mm), commercially available from Tosoh Corporation (Measurement Conditions)

Solvent: tetrahydrofuran (THF)
Measurement temperature: 40° C.
Flow rate: 0.35 ml/min
Sample concentration: 10 mg/THF 5 ml
Injection amount: 20 µl (Content of Component (A))

The content of the component (A) in the photosensitive resin composition may be appropriately selected and is preferably in a range of 20 to 80 mass %, more preferably in a range of 30 to 70 mass % a, and most preferably in a range of 30 to 50 mass % in order to improve heat resistance, electrical properties, and chemical resistance of the coating with respect to the total solid content of the photosensitive resin composition. In this specification, the "solid content" refers to a non-volatile content excluding volatile substances such as water and diluents contained in the photosensitive resin composition and indicates components that are not evaporated and volatilized but remain when the resin composition is dried, and includes liquid, syrup, and wax materials at room temperature of about 25° C.

(Total Content of Component (A1) and Component (A2) in Component (A))

When a combination of the component (A1) and the component (A2) is used as the component (A), a total content of the component (A1) and the component (A2) in the component (A) may be appropriately selected and is preferably in a range of 80 to 100 mass, more preferably in a range of 90 to 100 mass %, and most preferably 95 to 100 mass % because a resist shape having improved linearity in the depth direction of the resist pattern contour can be formed, and electroless plating resistance and solder heat resistance are improved. In addition, when the component (A1) and the component (A2) are used alone, they may be appropriately selected in the above range.

(Mass Ratio Between Component (A1) and Component (A2))

When a combination of the component (A1) and the component (A2) is used as the component (A), the mass ratio (A1/A2) may be appropriately selected and is preferably in a range of 20/80 to 90/10, more preferably in a range of 20/80 to 80/20, and most preferably in a range of 30/70 to 70/30 because a resist shape having improved linearity in the depth direction of the resist pattern contour can be formed, and electroless plating resistance and solder heat resistance are improved.

<Photopolymerization Initiator (B)>

The component (B) used in the present embodiment is not particularly limited as long as the component (D) to be described below can be polymerized, and can be appropriately selected from among generally used photopolymerization initiators. Examples thereof include conventionally known photopolymerization initiators such as an alkylphenone photopolymerization initiator, an acylphosphine oxide photopolymerization initiator, a titanocene photopolymerization initiator, and an oxime ester photopolymerization initiator, and these photopolymerization initiators may be used alone or a plurality of types thereof may be used in combination. Among these, an alkylphenone photopolymerization initiator, an acylphosphine oxide photopolymerization initiator or an oxime ester photopolymerization initiator is preferably used, and an alkylphenone photopolymerization initiator or an acylphosphine oxide photopolymerization initiator is particularly preferably used because a resist shape having improved linearity in the depth direction of the resist pattern contour can be formed, and electroless plating resistance and solder heat resistance are improved.

Examples of alkylphenone photopolymerization initiators include benzyldimethyl ketal photopolymerization initiators such as 2-methyl-1-(4-methylthiophenyl)-2-morpholino-1-propanone and 2-benzyl-2-dimethylamino-1-(4-morpholinophenyl)-butanone-1,2,2-dimethoxy-1,2-diphenylethane-1-one; α-hydroxy alkylphenone photopolymerization initiators such as 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, and 2-hydroxy-1-{4-[4-(2-hydroxy-2-methyl-propionyl)-benzyl]phenyl}-2-methyl-propan-1-one; and α-aminoacetophenone photopolymerization initiators such as 2-methyl-1-[4-(methylthio)phenyl]-2-morpholinopropanone-1,2-benzyl-2-dimethylamino-1-(4-morpholinophenyl)-butan-1-one, 2-(dimethylamino)-2-[(4-methylphenyl) methyl]-1-[4-(4-morpholinyl)phenyl]-1-butanone, and N,N-dimethylaminoacetophenone and these can be used alone or a plurality of types thereof can be used in combination.

The acylphosphine oxide photopolymerization initiator is not particularly limited as long as it is a compound having an acylphosphine oxide group (=P(=O)—C(=O)-group), and examples thereof include (2,6-dimethoxybenzoyl)-2,4,4-pentylphosphine oxide, 2,4,6-trimethylbenzoyldiphenylphosphine oxide, ethyl-2,4,6-trimethylbenzoylphenylphosphine oxide, bis(2,4,6-trimethylbenzoyl) phenylphosphine oxide, (2,5-dihydroxyphenyl) diphenylphosphine oxide, (p-hydroxyphenyl) diphenylphosphine oxide, bis(p-hydroxyphenyl) phenylphosphine oxide, and tris(p-hydroxyphenyl) phosphine oxide, and bis(2,6-dimethoxybenzoyl)-2,4,4-trimethyl-pentylphosphine oxide, and these can be used alone or a plurality of types thereof can be used in combination.

Examples of titanocene photopolymerization initiators include bis(η5-2,4-cyclopentadien-1-yl)-bis(2,6-difluoro-3-(1H-pyrrol-1-yl)-phenyl)titanium, and these can be used alone or a plurality of types thereof can be used in combination.

Examples of oxime ester photopolymerization initiators include ethanone, 1-[9-ethyl-6-(2-methylbenzoyl)-9H-carbazol-3-yl]-, 1-(0-acetyloxime), and the like. In addition, regarding other photopolymerization initiators, benzoin photopolymerization initiators such as benzoin, benzoin methyl ether, and benzoin isopropyl ether, aromatic ketone photopolymerization initiators such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, and 2-benzyl-2-dimethylamino-1-(4-morpholinophenyl)-butanone-1,2-methyl-1-[4-methylthio)-2-phenyl)-2-morpholino-propanone-1, anthraquinone photopolymerization initiator such as 2-methylanthraquinone, 2-ethylanthraquinone, 2-tert-butylanthraquinone, 1-chloroanthraquinone, 2-amylanthraquinone, and 2-aminoanthraquinone, ketal photopolymerization initiators such as acetophenone dimethyl ketal and benzyldimethyl ketal, benzophenone photopolymerization initiators such as benzophenone, methylbenzophenone, 4,4'-dichlorobenzophenone, and 4-benzoyl-4'-methyldiphenyl sulfide, acridine derivative photopolymerization initiators such as 9-phenylacridine, and 1,7-bis(9,9'-acridinyl)heptane, and imidazole dimer photopolymerization initiators of 2,4,5-triarylimidazole dimer or its derivative can be used. These can be used alone or a plurality of types thereof can be used in combination.
(Content of Component (B))

The content of the component (B) may be appropriately selected and is 0.2 to 15 mass %, 0.4 to 5 mass %, or 0.6 to 1 mass % with respect to the total solid content of the photosensitive resin composition in order to obtain a photosensitive resin composition that can form a resist shape having improved linearity in the depth direction of the resist pattern contour. In addition, when the content of the component (B) is 0.2 mass % or more, the exposed part is less likely to elute during development, and when the content thereof is 15 mass % or less, reduction in heat resistance can be minimized.

<Photopolymerization Sensitizer Containing Benzophenone Compound (C)>

The photopolymerization sensitizer of the component (C) includes a benzophenone compound as an essential component, and as necessary, a photopolymerization sensitizer other than the benzophenone compound can be used in combination with the benzophenone compound. The benzophenone compound which is an essential component in the component (C) is preferably a benzophenone compound having one or more groups selected from the group consisting of a functional group exhibiting photopolymerizability, for example, an alkyl amino group such as an amino group, an ethylamino group, a dimethylamino group, a diethylamino group, and a dibutylamino group, a hydroxy group, a methoxy group, an ethoxy group, a butoxy group and a phenyl group, more preferably a benzophenone compound having two or more groups selected from the group consisting of an dialkyl amino group such as an amino group, a dimethylamino group, a diethylamino group, and a dibutylamino group, a hydroxy group, a methoxy group, an ethoxy group, a butoxy group and a phenyl group, still more preferably a benzophenone compound having two or more diethylamino groups or hydroxy groups, and most preferably 4,4'-bis(diethylamino)benzophenone. The benzophenone compounds of the component (C) can be used alone or two or more types thereof can be used in combination.

Preferable examples of benzophenone compounds of the component (C) include 4,4'-diaminobenzophenone, 4,4'-bis (dimethylamino)benzophenone, 4,4'-bis(diethylamino)benzophenone, 4,4'-bis(dibutylamino)benzophenone, 4-ethylaminobenzophenone, 2,4-dihydroxybenzophenone, 3,4-dihydroxybenzophenone, 2,3,4-trihydroxybenzophenone, 2,3,4,4'-tetrahydroxybenzophenone, 2,2',4,4'-tetrahydroxybenzophenone, 2,2',4,4'-tetramethoxybenzophenone, 2,2',4,4'-tetraethoxybenzopbenone, 2,2',4,4'-tetrabutoxybenzophenone, 2,2'-dihydroxy-4,4'-dimethoxybenzophenone, 2,2'-dihydroxy-4,4'-diethoxybenzophenone, 2,2'-dihydroxy-4,4'-dibutoxybenzophenone, 4,4'-dihydroxybenzophenone, 4,4'-dimethoxybenzophenone, 4,4'-dibutoxybenzophenone, and 4,4'-diphenylbenzophenone. These benzophenone compounds can be used alone or a plurality of types thereof can be used in combination.

Examples of photopolymerization sensitizers that can be used in combination with the benzophenone compound as necessary as the component (C) include a pyrazoline compound, an anthracene compound, a coumarin compound, a xanthone compound, a thioxanthone compound, an oxazole compound, a benzo oxazole compound, a thiazole compound, a benzothiazol compound, a triazole compound, a stilbene compound, a triazine compound, a thiophene compound, a naphthalimide compound, and a triarylamine compound. Among these, a thioxanthone compound is preferably used. Specific examples of photopolymerization sensitizers as thioxanthone compounds include thioxanthone, 2,4-diethylthioxanthen-9-one, 2-isopropylthioxanthone, and 2-chlorothioxanthone.

When photopolymerization sensitizers other than these benzophenone compounds are used, these can be used alone or two or more thereof can be used in combination.
(Content of Benzophenone Compound which is Component (C))

The content of the benzophenone compound which is the component (C) may be appropriately selected and is preferably in a range of 0.001 to 20 mass %, more preferably in a range of 0.01 to 10 mass %, still more preferably in a range of 0.01 to 2.0 mass %, and most preferably in a range of 0.01 to 0.1 mass % with respect to the total solid content in the photosensitive resin composition. When the content is 0.001 mass % or more, it becomes easier to use both a direct-write exposure machine and a projection exposure machine, and when the content is 20 mass % or less, a favorable cross-sectional shape tends to be easily formed.
(Content of Photopolymerization Sensitizer Other than Benzophenone Compound)

When a photopolymerization sensitizer that can be used as necessary as the component (C) is added in addition to the benzophenone compound, its content may be appropriately selected and is preferably in a range of 0.001 to 1 mass %, more preferably in a range of 0.005 to 0.5 mass %, and most preferably in a range of 0.01 to 0.1 mass % with respect to the total solid content in the photosensitive resin composition. When the content is 0.001 mass % or More, it becomes easier to use both a direct-write exposure machine and a projection exposure machine, and when the content is 1 mass % or less, a favorable cross-sectional shape tends to be easily obtained.
(Content of Entire Component (C))

When a photopolymerization sensitizer that can be used as necessary as the component (C) is added in addition to the benzophenone compound, the content of all photo polymerization sensitizers added may be appropriately selected and is preferably in a range of 0.002 to 21 mass %, more preferably in a range of 0.005 to 1.0 mass %, still more preferably in a range of 0.005 to 1 mass %, and most preferably in a range of 0.01 to 0.5 mass % with respect to the total solid content in the photosensitive resin composition. When the content is 0.002 mass % or more, it becomes easier to use both a direct-write exposure machine and a projection exposure machine, and when the content is 21 mass % or less, a favorable cross-sectional shape tends to be easily obtained.

<Photopolymerizable Compound (D)>

The component (D) is not particularly limited as long as it is a compound having a functional group exhibiting photopolymerizability, for example, an ethylenic unsaturated group such as a vinyl group, an allyl group, a propagyl group, a butenyl group, an ethynyl group, a phenyl ethynyl group, a maleimide group, a nadiimide group, and a (meth) acryloyl group, and a compound having a (meth)acryloyl group is preferable in consideration of reactivity.

Here, in this specification, the (meth)acryloyl group refers to an acryloyl group or a methacryloyl group, and the (meth)acrylate refers to an acrylate or a methacrylate.

Preferable examples of the component (D) include hydroxyalkyl(meth)acrylates such as 2-hydroxyethyl(meth) acrylate, and 2-hydroxypropyl(meth)acrylate, glycol mono- or di(meth)acrylates such as ethylene glycol, methoxytetraethylene glycol, and polyethylene glycol, (meth)acrylamides such as N,N-dimethyl(meth)acrylamide and N-methylol (meth)acrylamide, aminoalkyl(meth)acrylates such as N,N-dimethylaminoethyl(meth)acrylate, polyvalent(meth)acrylates of a polyhydric alcohol such as hexanediol, trimethylolpropane, pentaerythritol, ditrimethylolpropane, dipentaerythritol, tris-hydroxyethyl isocyanurate or its ethylene oxide or propylene oxide adduct, (meth)acrylates of an ethylene oxide or propylene oxide adduct of phenols such as phenoxyethyl(meth)acrylate, and bisphenol A polyethoxydi (meth)acrylate, and (meth)acrylates of glycidyl ether such as glycerin diglycidyl ether, trimethylolpropane triglycidyl ether, triglycidyl isocyanurate and melamine(meth)acrylate. These components (D) can be used alone or a plurality of types thereof can be used in combination.

In addition, the polyhydric alcohol or polyvalent(meth) acrylates of its ethylene oxide or propylene oxide adduct may be included.

(Content of Component (D))

The content of the component (D) may be appropriately selected and is preferably 2 to 50 mass %, more preferably 3 to 20 mass %, and most preferably 3 to 10 mass % with respect to the total solid content in the photosensitive resin composition. When the content is 2 mass % or more, since the light sensitivity is low, a tendency in which the exposed part elutes during development can be curbed and when the content is 50 mass % or less, reduction in heat resistance can be minimized.

<Pigment (E)>

In addition, a pigment (E) can be added to the photosensitive resin composition of the present embodiment as necessary. The component (E) is preferably used according to a desired color when the wiring is concealed. Regarding the component (E), a colorant that develops a desired color may be appropriately selected, and preferable examples include known colorants such as phthalocyanine blue, phthalocyanine green, iodin green, diazo yellow, crystal violet, titanium oxide, carbon black, and naphthalene black.

(Content of Component (E))

When the component (E) is used, the content of the component (E) may be appropriately selected and is preferably 0.1 to 5 mass %, more preferably 0.1 to 3 mass %, and most preferably 0.5 to 2 mass % with respect to the total solid content in the photosensitive resin composition in order to conceal the wiring further.

<Inorganic Filler (F)>

In addition, in order to further improve various properties such as adhesion and coating hardness, an inorganic filler (F) can be used as necessary in the photosensitive resin composition of the present embodiment. Regarding the component (F), for example, silica ($SiO_2$), alumina ($Al_2O_3$), zirconia ($ZrO_2$), talc ($3MgO·4SiO_2·H_2O$), aluminum hydroxide ($Al(OH)_3$), calcium carbonate ($CaCO_3$), barium sulfate ($BaSO_4$), calcium sulfate ($CaSO_4$), zinc oxide ($ZnO$), magnesium titanate ($MgO·TiO_2$), carbon (C), or the like can be used. These inorganic fillers can be used alone or a plurality of types thereof can be used in combination.

The average particle size of the component (F) may be appropriately selected and is preferably 0.1 to 20 µm, more preferably 0.1 to 10 µm, still more preferably 0.1 to 5 µm, and most preferably 0.1 to 1 µm. When the average particle size is 20 µm or less, reduction in insulation reliability can be further minimized. Here, the average particle size of the component (F) is measured using a dynamic light scattering nanotrac particle size distribution analyzer "UPA-EX150" (commercially available from Nikkiso Co., Ltd.) and a laser diffraction scattering microtrac particle size distribution analyzer "MT-3100" (commercially available from Nikkiso Co., Ltd.).

Among the components (F), silica is preferably included because heat resistance can be improved, barium sulfate is preferably included because solder heat resistance, crack resistance (thermal shock resistance), and the adhesive strength between an underfill material and a cured film after a PCT resistance test can be improved, and silica and barium sulfate may be included in combination. In addition, in order to improve an aggregation preventing effect, an inorganic filler of which the surface is treated with an alumina or an organosilane compound may be appropriately selected.

The elemental composition of aluminum on the surface of the inorganic filler of which the surface is treated with an alumina or an organosilane compound may be appropriately selected and is preferably 0.5 to 10 atom %, more preferably 1 to 5 atom %, and most preferably 1.5 to 3.5 atom %. In addition, the elemental composition of silicon on the surface of the inorganic filler of which the surface is treated with an organosilane compound may be appropriately selected and is preferably 0.5 to 10 atom %, more preferably 1 to 5 atom %, and most preferably 1.5 to 3.5 atom %. In addition, the elemental composition of carbon on the surface of the inorganic filler of which the surface is treated with an organosilane compound may be appropriately selected and is preferably 10 to 30 atom/o, more preferably 15 to 25 atom %, and most preferably 18 to 23 atom %. These elemental compositions can be measured through XPS.

Regarding the inorganic filler of which the surface is treated with an alumina or an organosilane compound, for example, NanoFine BFN40DC (product name, commercially available from Nippon Solvay K.K), is commercially available as barium sulfate of which the surface is treated with an alumina or an organosilane compound.

(Content of Component (F))

When the component (F) is used, its content may be appropriately selected and is preferably 10 to 80 mass %, more preferably 15 to 70 mass %, still more preferably 20 to 50 mass %, and most preferably 25 to 40 mass % with respect to the total solid content of the photosensitive resin composition. Within the above range, it is possible to further improve the cured product strength, heat resistance, insulation reliability, thermal shock resistance, and resolution of the photosensitive resin composition.

When silica is used as the component (F), the content of silica may be appropriately selected and is preferably 5 to 60 mass %, more preferably 15 to 55 mass %, and most preferably 15 to 50 mass % with respect to the total solid content of the photosensitive resin composition. In addition, when barium sulfate is used as the component (F), the content of barium sulfate may be appropriately selected and is preferably 5 to 30 mass %, more preferably 5 to 25 mass %, and most preferably 5 to 20 mass % with respect to the total solid content of the photosensitive resin composition. Within the above range, it is possible to further improve solder heat resistance and the adhesive strength between an underfill material and a cured film after a PCT resistance test.

<Diluent>

In the photosensitive resin composition of the present embodiment, as necessary, a diluent can be used. Regarding the diluent, for example, an organic solvent can be used. Examples of organic solvents include ketones such as methyl ethyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum solvents such as petroleum ether, oil naphtha, hydrogenated naphtha, and solvent naphtha.

An amount of the diluent used may be appropriately selected so that the content of the total solid content in the photosensitive resin composition is preferably 50 to 90 mass %, more preferably 60 to 80 mass %, and most preferably 65 to 75 mass %. That is, when the diluent is used, the content of the diluent in the photosensitive resin composition may be appropriately selected and is preferably 10 to 50 mass %, more preferably 20 to 40 mass %, and most preferably 25 to 35 mass %. Within the above range, it is possible to improve coating properties of the photosensitive resin composition and form a pattern with a higher definition.

<Curing Agent (G)>

In the photosensitive resin composition of the present embodiment, as necessary, a curing agent (G) may be included. Examples of the component (G) include a compound that cures directly by heat, ultraviolet rays, or the like, and a compound that cures according to a reaction with a carboxyl group or a hydroxyl group of the component (A) which is a photocurable component in the photosensitive resin composition of the present embodiment by heat, ultraviolet rays, or the like. When the curing agent is used, it is possible to improve heat resistance, adhesion, chemical resistance and the like of the final cured film.

Regarding the component (G), for example, an epoxy compound, a melamine compound, an oxazoline compound or the like may be exemplified as a thermosetting compound. Examples of epoxy compounds include a bisphenol A type epoxy resin, a bisphenol F type epoxy resin, a hydrogenated bisphenol A type epoxy resin, a brominated bisphenol A type epoxy resin, a novolak type epoxy resin, a bisphenol S type epoxy resin, a biphenyl type epoxy resin or a heterocyclic epoxy resin of triglycidyl isocyanurate or the like, and a bixylenol type epoxy resin. Examples of melamine compounds include triaminotriazine, hexamethoxymelamine, and hexabutoxylated melamine. Among these, in order to further improve heat resistance of the cured film, an epoxy compound (epoxy resin) is preferably included, and a combination of an epoxy compound and a block type isocyanate is more preferable.

Regarding the block type isocyanate, an addition reaction product of a polyisocyanate compound and an isocyanate blocking agent is used. Examples of polyisocyanate compounds include polyisocyanate compounds such as tolylene diisocyanate, xylylene diisocyanate, phenylene diisocyanate, naphthylene diisocyanate, bis(isocyanatomethyl)cyclohexane, tetramethylene diisocyanate, hexamethylene diisocyanate, methylene diisocyanate, trimethylhexamethylene diisocyanate, and isophorone diisocyanate, and their adducts, biuret forms, and isocyanurate products.

The components (G) may be used alone or a plurality of types thereof may be used in combination. When the component (G) is used, its content may be appropriately selected and is preferably 2 to 40 mass %, more preferably 3 to 30 mass %, and most preferably 5 to 20 mass % with respect to the total solid content of the photosensitive resin composition. Within the above range, it is possible to further improve heat resistance of the formed cured film while maintaining favorable developing properties.

<Epoxy Resin Curing Agent (H)>

In addition, in the photosensitive resin composition of the present embodiment, as necessary, an epoxy resin curing agent (H) can be used in combination in order to further improve various properties such as heat resistance, adhesion, and chemical resistance of the final cured film.

Specific examples of the epoxy resin curing agent which is the component (H) include imidazole derivatives such as 2-methylimidazole, 2-ethyl-4-methylimidazole, 1-benzyl-2-methylimidazole, 2-phenylimidazole, and 2-phenyl-4-methyl-5-hydroxymethylimidazole: guanamins such as acetoguanamine and benzoguanamine: polyamines such as diaminodiphenylmethane, m-phenylenediamine, m-xylenediamine, diaminodiphenyl sulfone, dicyandiamide, urea, urea derivatives, melamine, and polybasic hydrazide: their organic acid salts or epoxy adducts: amine complexes of boron trifluoride: and triazine derivatives such as ethyldiamino-S-triazine, 2,4-diamino-S-triazine, and 2,4-diamino-6-xylyl-S-triazine.

The epoxy resin curing agents as the component (H) can be used alone or a plurality of types thereof can be used in combination. When the epoxy resin curing agent is used, in order to improve reliability, the content of the epoxy resin curing agent in the photosensitive resin composition may be appropriately selected and is preferably 0.01 to 20 mass %, and more preferably 0.1 to 10 mass % with respect to the total solid content of the photosensitive resin composition.

<Elastomer (I)>

An elastomer (I) can be included in the photosensitive resin composition of the present embodiment. Particularly, the component (I) can be suitably used when the photosensitive resin composition of the present embodiment is used for a semiconductor package substrate. When the component (I) is added, reduction in flexibility and adhesive strength due to internal distortion (internal stress) of the resin resulting from curing contraction of the component (A) can be minimized. That is, it is possible to improve the flexibility, adhesive strength, and the like of the cured film formed using the photosensitive resin composition.

Examples of the component (I) include a styrene elastomer, an olefin elastomer, a urethane elastomer, a polyester elastomer, a polyamide elastomer, an acrylic elastomer, and a silicone elastomer. Such an elastomer is composed of a hard segment component and a soft segment component, and generally, the former contributes to heat resistance and strength, and the latter contributes to flexibility and toughness.

An urethane elastomer is formed of a structural unit having a hard segment including a low-molecular-weight glycol and a diisocyanate, and a soft segment including a high-molecular-weight (long chain) diol and a diisocyanate. Specific examples of high-molecular-weight (long chain) diols include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number average molecular weight of the high-molecular-weight (long chain) diol is preferably 500 to 10,000. In addition to ethylene glycol, short chain diols such as propylene glycol, 1,4-butanediol, and bisphenol A can be used, and the number average molecular weight of the short chain diol is preferably 48 to 500. Regarding specific examples of urethane elastomers, PANDEX T-2185, and T-2983N (commercially available from DIC Corporation), Silactone E790, and the like are commercially available.

Examples of polyester elastomers include those obtained by polycondensation of dicarboxylic acid or its derivative and a diol compound or its derivative. Specific examples of dicarboxylic acids include aromatic dicarboxylic acids such as terephthalic acid, isophthalic acid, and naphthalene dicarboxylic acid, aromatic dicarboxylic acids in which hydrogen atoms on these aromatic nuclei are substituted with a methyl group, an ethyl group, a phenyl group, or the like, aliphatic dicarboxylic acids having 2 to 20 carbon atoms such as adipic acid, sebacic acid, and dodecane dicarboxylic acid, and alicyclic dicarboxylic acids such as cyclohexanedicarboxylic acid. These compounds can be used alone or a plurality of types thereof can be used.

Specific examples of diol compounds include aliphatic diols and alicyclic diols such as ethylene glycol, 1,3-propanediol, 1,4-butanediol, 1,6-hexanediol, 1,10-decanediol, and 1,4-cyclohexanediol, dihydric phenols represented by the following General Formula (VI), and the like.

[Chem. 12]

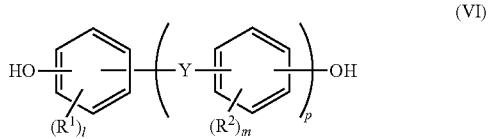

(VI)

In General Formula (VI), Y represents an alkylene group having 1 to 10 carbon atoms, a cycloalkylene group having 4 to 8 carbon atoms, a divalent functional group selected from the group consisting of —O—, —S— and —SO$_2$—, or direct bonding of benzene rings, $R^1$ and $R^2$ each independently represent a hydrogen atom, a halogen atom or an alkyl group having 1 to 12 carbon atoms, l and m each independently represent an integer of 0 to 4, and p represents 0 or 1. The alkylene group and the cycloalkylene group may be linear or branched, and may be substituted with a halogen atom, an alkyl group, an aryl group, an aralkyl group, an amino group, an amide group, an alkoxy group or the like.

Specific examples of the dihydric phenol represented by General Formula (VI) include bisphenol A, bis-(4-hydroxyphenyl)methane, bis-(4-hydroxy-3-methylphenyl)propane, and resorcinol. These compounds can be used alone or a plurality of types thereof can be used.

In addition, a multiblock copolymer including an aromatic polyester (for example, polybutylene terephthalate) part as a hard segment component and an aliphatic polyester (for example, polytetramethylene glycol) part as a soft segment component can be used. There are various grades depending on the type, ratio, difference of molecular weights of the hard segment and the soft segment. Specifically, Hytrel (commercially available from Du Pont-Toray Co., Ltd., "Hytrel" is a registered trademark), Pelprene (commercially available from Toyobo Co., Ltd., "Pelprene" is a registered trademark), Esper (commercially available from Hitachi Chemical Company, "Esper" is a registered trademark), and the like are commercially available.

Examples of acrylic elastomers include those synthesized using an acrylic ester such as ethyl acrylate, butyl acrylate, methoxyethyl acrylate, or ethoxyethyl acrylate as a main component. In addition, regarding crosslinking point monomers, glycidyl methacrylate, allylglycidyl ether, and the like may be used. In addition, acrylonitrile or ethylene can be copolymerized. Specific examples thereof include an acrylonitrile-butyl acrylate copolymer, an acrylonitrile-butyl acrylate-ethyl acrylate copolymer, and an acrylonitrile-butyl acrylate-glycidyl methacrylate copolymer.

In addition, in addition to the above thermoplastic elastomer, a rubber-modified epoxy resin can be used. For example, the rubber-modified epoxy resin is obtained by modifying some or all of epoxy groups of the above bisphenol F type epoxy resin, bisphenol A type epoxy resin, salicylaldehyde type epoxy resin, phenol novolak type epoxy resin or cresol novolak type epoxy resin with a both-terminal carboxylic acid-modified butadiene-acrylonitrile rubber, a terminal amino-modified silicone rubber, or the like. Among these elastomers, in consideration of shear adhesion, a both-terminal carboxyl group-modified butadiene-acrylonitrile copolymer or Esper (commercially available from Hitachi Chemical Company, product name: Esper 1612, 1620) which is a polyester elastomer having a hydroxyl group is preferable.

When the component (1) is used, its content may be appropriately selected and is preferably 2 to 40 parts by mass, more preferably 4 to 30 parts by mass, still more preferably 10 to 25 parts by mass, and most preferably 15 to 22 parts by mass with respect to 100 parts by mass of the component (A) (solid content). Within the above range, the elastic modulus of the cured film in a high temperature range decreases and an unexposed part is more easily eluted in a developing solution.

<Other Additives>

In the photosensitive resin composition of the present embodiment, as necessary, various commonly known additives, for example, a polymerization inhibitor such as hydroquinone, methylhydroquinone, hydroquinone monomethyl ether, catechol, and pyrogallol, a thickener such as bentonite and montmorillonite, a silicone, fluorine, or vinyl resin anti-foaming agent, a silane coupling agent, and the like can be used. In addition, flame retardants such as a brominated epoxy compound, an acid-modified brominated epoxy compound, an antimony compound, a phosphate compound of a phosphorus compound, an aromatic condensed phosphate ester, and a halogen-containing condensed phosphate ester can be used.

In addition, in the photosensitive resin composition of the present embodiment, additionally, as necessary, the triazine compound (1) such as melamine may be used as an adhesion imparting agent.

The photosensitive resin composition of the present embodiment can be obtained by uniformly kneading and mixing components added using a roll mill, a bead mill, or the like.

[Dry Film]

A dry film of the present embodiment includes a carrier film and a photosensitive layer using the photosensitive resin composition of the present embodiment.

The thickness of the photosensitive layer is not particularly limited, and may be appropriately selected and is preferably 10 to 50 μm, more preferably 15 to 40 μm, and most preferably 20 to 30 μm.

For example, the dry film of the present embodiment can be manufactured by applying the photosensitive resin composition of the present embodiment to a carrier film according to known methods such as reverse roll coating, gravure roll coating, comma coating, and curtain coating, and performing drying to form a photosensitive layer.

Examples of carrier films include films made of polyesters such as polyethylene terephthalate, and polybutylene terephthalate, and films of made of polyolefins such as polypropylene and polyethylene. The thickness of the carrier film is not particularly limited, and may be appropriately selected and is preferably in a range of 5 to 100 μm. In addition, in the dry film of the present embodiment, a protective layer can be laminated on the surface opposite to the surface in contact with the carrier film of the photosensitive layer. Regarding the protective layer, for example, a polymer film made of polyethylene, polypropylene, or the like may be used. In addition, the same polymer film as the above carrier film may be used or a different polymer film may be used.

The coating can be dried using a dryer using hot air, far infrared rays, or near infrared rays, or the like, and the drying temperature may be appropriately selected and is, for example, preferably 60 to 120° C., more preferably 70 to 110° C., and most preferably 80 to 100° C. In addition, the drying time may be appropriately selected, and is, for example, preferably 1 to 60 minutes, more preferably 2 to 30 minutes, and most preferably 5 to 20 minutes.

[Printed Wiring Board]

A printed wiring board of the present embodiment includes a permanent mask resist formed of the photosensitive resin composition of the present embodiment.

Since the printed wiring board of the present embodiment includes a permanent mask resist formed of the photosensitive resin composition of the present embodiment, an undercut in which the bottom portion is hollowed and omission of the top of the resist do not occur, and the line width of the intermediate portion (central portion) and the deepest portion (bottom portion) in the depth direction of the cross section of the resist pattern does not become larger than the line width of the surface portion. Therefore, the resist pattern has favorable linearity in the depth direction of the pattern contour (edge), an excellent cross-sectional shape, and an excellent resolution. In addition, the permanent mask resist has a resist pattern having excellent formation stability for reducing the size of a hole diameter (opening diameter) and an interval pitch between holes along with reducing the size and higher performance of electronic devices in recent years.

[Printed Wiring Board Manufacturing Method]

A printed wiring board manufacturing method of the present embodiment includes a process of providing a photosensitive layer on a substrate using the photosensitive resin composition of the present embodiment or the dry film of the present embodiment, a process of forming a resist pattern using the photosensitive layer, and a process of curing the resist pattern to form a permanent mask resist, in this order.

Specifically, for example, the board can be manufactured as follows.

First, using a method such as a screen printing method, a spray method, a roll coating method, a curtain coating method, or an electrostatic coating method, the photosensitive resin composition is applied to a metal-clad laminate substrate such as a copper-clad laminate at a film thickness that is appropriately selected and is, for example, 10 to 200 μm, preferably 15 to 150 μm, more preferably 20 to 100 μm, and most preferably 23 to 50 μm. Next, the coating is preferably dried at 60 to 110° C. or the dry film of the present embodiment from which the protective layer is peeled off is thermally laminated on the substrate using a laminator, and thereby the photosensitive layer is provided on the substrate.

Next, a negative film is brought into direct contact (or non-contact via a transparent film such as a carrier film) with the photosensitive layer, active light is emitted in an exposure amount that is appropriately selected and is, for example, 10 to 2,000 mJ/cm$^2$, preferably 100 to 1,500 mJ/cm$^2$, and more preferably 300 to 1,000 mJ/cm$^2$. Then, an unexposed part is dissolved and removed (developed) in a dilute alkaline aqueous solution to form a resist pattern. Examples of active light used include electron beams, ultraviolet rays, and X-rays, and ultraviolet rays are preferable. In addition, a low pressure mercury lamp, a high pressure mercury lamp, an ultra high pressure mercury lamp, a halogen lamp, or the like can be used as a light source.

Next, the exposed part of the photosensitive layer is sufficiently cured according to at least one treatment of post-exposure (ultraviolet ray exposure) and post-heating to form a permanent mask resist.

An exposure amount for post-exposure may be appropriately selected and is preferably 100 to 5,000 mJ/cm$^2$, more preferably 500 to 2,000 mJ/cm$^2$, and most preferably 700 to 1,500 J/cm$^2$.

The heating temperature for post-heating may be appropriately selected and is preferably 100 to 200° C., more preferably 120 to 180° C., and most preferably 135 to 165° C.

The heating time for post-heating may be appropriately selected and is preferably 5 minutes to 12 hours, more preferably 10 minutes to 6 hours, and most preferably 30 minutes to 2 hours.

In consideration of the insulation and resolution, the thickness of the permanent mask resist formed in this manner is preferably 10 μm or more, more preferably 10 to 100 μm, and most preferably 10 to 50 μm.

Then, etching is performed to form a wiring and a printed wiring board is produced.

EXAMPLES

While objects and advantages of the present embodiment will be described below in more detail with reference to examples and comparative examples, the present embodiment is not limited to the following examples.

Synthesis Example 1

350 parts by mass of a bisphenol F novolak type epoxy resin (a)(EXA-7376, commercially available from DIC Corporation, a bisphenol F novolak type epoxy resin having a structural unit in which Y$^3$ and Y$^4$ represent a glycidyl group and R$^2$ represents a hydrogen atom in General Formula (II), epoxy equivalent: 186), 70 parts by mass of an acrylic acid (b), 0.5 parts by mass of methyl hydroquinone, and 120 parts by mass of carbitol acetate were prepared, and reacted by heating and stirring at 90° C., and the mixture was completely dissolved. Next, the obtained solution was cooled to 60° C., 2 parts by mass of triphenylphosphine was added thereto, and mixture was heated at 100° C., and reacted until the acid value of the solution was 1 mg KOH/g or less, and thereby a solution containing a component (A1') was obtained. 98 parts by mass of tetrahydrophthalic anhydride (THPAC) (c) and 85 parts by mass of carbitol acetate were added to the solution after the reaction, and the mixture was heated at 80° C. and reacted for 6 hours. Then, cooling was performed to room temperature, and a THPAC modified bisphenol F novolak type epoxy acrylate (epoxy resin (1)) as the component (A1) in which the concentration of the solid content was 73 mass % was obtained.

Synthesis Example 2

1,052 parts by mass of a bisphenol F type epoxy resin (a bisphenol F type epoxy resin having a structural unit in which $Y^6$ represents a glycidyl group, and $R^{14}$ represents a hydrogen atom in General Formula (IV)) (a) (epoxy equivalent: 526), 144 parts by mass of an acrylic acid (b), 1 part by mass of methyl hydroquinone, 850 parts by mass of carbitol acetate and 100 parts by mass of solvent naphtha were put into a flask including a stirrer, a reflux condenser, and a thermometer, and heated and stirred at 70° C., and the mixture was dissolved. Next, the solution was cooled to 50° C., 2 parts by mass of triphenylphosphine and 75 parts by mass of solvent naphtha were prepared, and heated at 100° C., and reacted until the acid value of the solid content was 1 mg KOH/g or less, and thereby a solution containing a component (A2') was obtained. Next, the obtained solution was cooled to 50° C., and 745 parts by mass of tetrahydrophthalic anhydride (THPAC) (c), 75 parts by mass of carbitol acetate, and 75 parts by mass of solvent naphtha were prepared, and heated at 80° C. and reacted for 6 hours. Then, cooling was performed to room temperature, and a THPAC modified bisphenol F type epoxy acrylate (epoxy resin (2)) as the component (A2) in which the solid content acid value was 80 mg KOH/g, and the solid content was 62 mass % was obtained.

Examples 1 to 9 and Comparative Examples 1 to 5

Compositions were blended according to composition formulations shown in Table 1, and kneaded using a 3-roll mill to prepare photosensitive resin compositions. Carbitol acetate was added so that the concentration of the solid content was 70 mass % to obtain photosensitive resin compositions.

TABLE 1

| Components | | Materials | Examples | | | | | | |
|---|---|---|---|---|---|---|---|---|---|
| | | | 1 | 2 | 3 | 4 | 5 | 6 | 7 |
| (A) | A1 | Acid-modified vinyl goup-containing epoxy resin (I) obtained in Synthesis Example 1 | 13.55 | 13.55 | 13.55 | 13.55 | 13.55 | 13.55 | 13.55 |
| | A2 | Acid-modified vinyl group-containing epoxy resin (II) obtained in Synthesis Example 2 | 20.35 | 20.35 | 20.35 | 20.35 | 20.35 | 20.35 | 20.35 |
| (B) | | Irgacure 907 | 0.77 | 0.77 | 0.77 | 0.00 | 0.00 | 0.00 | 0.00 |
| | | Irgacure 819 | 0.00 | 0.00 | 0.00 | 0.77 | 0.77 | 0.77 | 0.00 |
| | | Irgacure 369 | 0.00 | 0.00 | 0.00 | 0.00 | 0.00 | 0.00 | 0.77 |
| | | Irgacure OXE02 | 0.00 | 0.00 | 0.00 | 0.00 | 0.00 | 0.00 | 0.00 |
| | | Irgacure TPO | 0.00 | 0.00 | 0.00 | 0.00 | 0.00 | 0.00 | 0.00 |
| (C) | | DETX | 0.04 | 0.04 | 0.04 | 0.04 | 0.04 | 0.04 | 0.04 |
| | | EAB | 0.01 | 0.05 | 0.10 | 0.01 | 0.05 | 0.10 | 0.05 |
| (D) | | DPHA | 4.89 | 4.89 | 4.89 | 4.89 | 4.89 | 4.89 | 4.89 |
| (E) | | Phthalocyanine pigment | 1.17 | 1.17 | 1.17 | 1.17 | 1.17 | 1.17 | 1.17 |
| (F) | | B34 | 11.37 | 11.37 | 11.37 | 11.37 | 11.37 | 11.37 | 11.37 |
| | | SFP20M | 31.27 | 31.27 | 31.27 | 31.27 | 31.27 | 31.27 | 31.27 |
| (G) | | Curing agent | 15.90 | 15.90 | 15.90 | 15.90 | 15.90 | 15.90 | 15.90 |
| (H) | | Melamine | 0.26 | 0.26 | 0.26 | 0.26 | 0.26 | 0.26 | 0.26 |

| Components | | Materials | Examples | | Comparative Examples | | | | |
|---|---|---|---|---|---|---|---|---|---|
| | | | 8 | 9 | 1 | 2 | 3 | 4 | 5 |
| (A) | A1 | Acid-modified vinyl goup-containing epoxy resin (I) obtained in Synthesis Example 1 | 13.55 | 13.55 | 13.55 | 13.55 | 13.55 | 13.55 | 13.55 |
| | A2 | Acid-modified vinyl group-containing epoxy resin (II) obtained in Synthesis Example 2 | 20.35 | 20.35 | 20.35 | 20.35 | 20.35 | 20.35 | 20.35 |
| (B) | | Irgacure 907 | 0.00 | 0.00 | 0.77 | 0.00 | 0.00 | 0.00 | 0.00 |
| | | Irgacure 819 | 0.00 | 0.00 | 0.00 | 0.77 | 0.00 | 0.00 | 0.00 |
| | | Irgacure 369 | 0.00 | 0.00 | 0.00 | 0.00 | 0.77 | 0.00 | 0.00 |
| | | Irgacure OXE02 | 0.77 | 0.00 | 0.00 | 0.00 | 0.00 | 0.77 | 0.00 |
| | | Irgacure TPO | 0.00 | 0.77 | 0.00 | 0.00 | 0.00 | 0.00 | 0.77 |
| (C) | | DETX | 0.04 | 0.04 | 0.04 | 0.04 | 0.04 | 0.04 | 0.04 |
| | | EAB | 0.05 | 0.05 | 0.00 | 0.00 | 0.00 | 0.00 | 0.00 |
| (D) | | DPHA | 4.89 | 4.89 | 4.89 | 4.89 | 4.89 | 4.89 | 4.89 |
| (E) | | Phthalocyanine pigment | 1.17 | 1.17 | 1.17 | 1.17 | 1.17 | 1.17 | 1.17 |
| (F) | | B34 | 11.37 | 11.37 | 11.37 | 11.37 | 11.37 | 11.37 | 11.37 |
| | | SFP20M | 31.27 | 31.27 | 31.27 | 31.27 | 31.27 | 31.27 | 31.27 |
| (G) | | Curing agent | 15.90 | 15.90 | 15.90 | 15.90 | 15.90 | 15.90 | 15.90 |
| (H) | | Melamine | 0.26 | 0.26 | 0.26 | 0.26 | 0.26 | 0.26 | 0.26 |

* Values in the table indicate parts by mass of solid content used to prepare photosensitive resin compositions Here, details of materials in Table 1 are as follows.

Epoxy resins (1) to (3) were acid-modified vinyl group-containing epoxy resins (1) to (3) obtained in Synthesis Examples 1 to 3, respectively.

Irgacure 907: 2-methyl-[4-(methylthio)phenyl]morpholino-1-propanone (product name, commercially available from BASF)

Irgacure 819: bis(2,4,6-trimethylbenzoyl)phenylphosphine oxide (product name, commercially available from BASF)

Irgacure 369: 2-benzyl-2-dimethylamino-1-(4-morpholinophenyl)-butanone-1 (product name, commercially available from BASF)

Irgacure OXE02: ethanone, 1-[9-ethyl-6-(2-methylbenzoyl)-9H-carbazol-3-yl]-, 1-(0-acetyloxime)(product name, commercially available from BASF)

Irgacure TPO: 2,4,6-trimethylbenzoyl-diphenyl-phosphine oxide (product name, commercially available from BASF)

DETX: DETX-S, 2,4-diethylthioxanthone (product name, commercially available from Nippon Kayaku Co., Ltd.)

EAB: 4,4'-bisdiethylaminobenzophenone (product name, commercially available from Hodogaya Chemical Co., Ltd.)

DPHA: dipentaerystol hexaacrylate (product name, commercially available from Nippon Kayaku Co., Ltd.)

Phthalocyanine pigment: phthalocyanine pigment (commercially available from Sanyo Color Works, Ltd.)

B34: barium sulfate particles (product name, commercially available from Sakai Chemical Industry Co., Ltd., average particle size: 0.3 μm)

SFP20M: silica particles (product name, commercially available from Denka Co., Ltd., average particle size: 0.3 μm)

Curing agent: YX4000X (product name, commercially available from Mitsubishi Chemical Corporation, biphenyl type epoxy resin)

Melamine: commercially available from Nissan Chemical Corporation

Next, evaluation was performed using the photosensitive resin compositions obtained above under the following conditions. The evaluation results are shown in Table 2.

[Test Piece Producing Method I]

The photosensitive resin compositions of examples and comparative examples were applied to copper-clad laminate substrates with a thickness of 0.6 mm (MCL-E-67, commercially available from Hitachi Chemical Company) according to a screen printing method so that the film thickness after drying was 35 μm, and then dried at 80° C. for 20 minutes using a hot air circulation type dryer. Next, a negative mask having a predetermined pattern (a pattern having a hole diameter of 50 μm and a distance between centers of holes of 50 μm) was adhered to the coating, and exposed in an exposure amount of 100 mJ/cm$^2$ using a projection type UV exposure device. Then, spray developing was performed in a 1 mass % sodium carbonate aqueous solution for 60 seconds at a pressure of $1.765 \times 10^5$ Pa, and an unexposed part was dissolved and developed. Next, exposure was performed in an exposure amount of 1000 mJ/cm$^2$ using an ultraviolet ray exposure device, and heating was performed at 150° C. for 1 hour, and thereby a test piece having a permanent mask resist was produced.

[Test Piece Producing Method II]

The photosensitive resin compositions of examples and comparative examples were applied to copper-clad laminate substrates with a thickness of 0.6 mm (MCL-E-67, commercially available from Hitachi Chemical Company) according to a screen printing method so that the film thickness after drying was 35 μm, and then dried at 80° C. for 20 minutes using a hot air circulation type dryer. Next, a negative mask having a predetermined pattern (a pattern having a hole diameter of 50 μm and a distance between centers of holes of 50 μm) was adhered to the coating, and exposed in an exposure amount of 100 mJ/cm$^2$ using a direct-write UV exposure device. Then, spray developing was performed in a 1 mass % sodium carbonate aqueous solution for 60 seconds at a pressure of $1.765 \times 10^5$ Pa, and an unexposed part was dissolved and developed. Next, exposure was performed in an exposure amount of 1000 mJ/cm$^2$ using an ultraviolet ray exposure device, and heating was performed at 150° C. for 1 hour, and thereby a test piece having a permanent mask resist was produced.

[Resolution I]

The test piece produced according to the producing method I was cast on an epoxy resin (Epikote 828 (product name, commercially available from Japan Epoxy Resin Corporation), use triethylenetetramine as a curing agent) and sufficiently cured and then polished using a polishing machine (Refine Polisher (commercially available from Refine Tec Ltd.)), and the cross section of the pattern was cut out, and the resist shape was observed under a metal microscope. Determination was performed according to the following criteria.

A: In the resist shape, it was confirmed that there were no undercut and omission of the top of the resist and the linear shape in the depth direction of the pattern contour was favorable (refer to FIG. 1).

Figure 2:
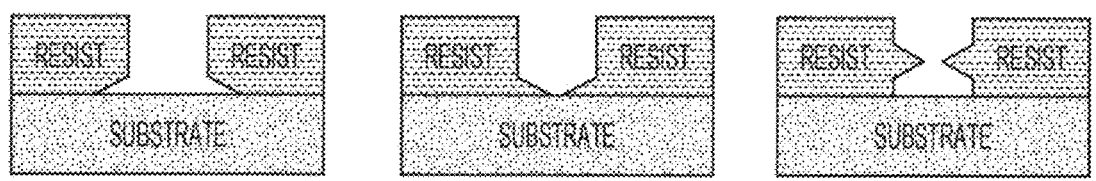
FIG. 2 is a schematic view showing a resist cross-sectional shape having poor linearity in the depth direction of a resist pattern contour.

B: In the resist shape, it was confirmed that there was an undercut and omission of the top of the resist, and the linearity in the depth direction of the pattern contour was poor (refer to FIG. 2).

[Resolution II]

The test piece produced according to the producing method II was cast on an epoxy resin (Epikote 828 (product name, commercially available from Japan Epoxy Resin Corporation), use triethylenetetramine as a curing agent) and sufficiently cured and then polished using a polishing machine (Refine Polisher (commercially available from Refine Tec Ltd.)), and the cross section of the pattern was cut out, and the resist shape was observed under a metal microscope. Determination was performed according to the following criteria.

A: in the resist shape, it was confirmed that there were no undercut and omission of the top of the resist and the linear shape in the depth direction of the pattern contour was favorable (refer to FIG. 1).

B: In the resist shape, it was confirmed that there was an undercut and omission of the top of the resist, and the linearity in the depth direction of the pattern contour was poor (refer to FIG. 2).

[Adhesion]

The photosensitive resin compositions of examples and comparative examples were applied to copper foils with a thickness of 35 μm (commercially available from Nippon Denkai, Ltd.) according to a screen printing method so that the film thickness after drying was 35 μm, and then dried at 80° C. for 20 minutes using a hot air circulation type dryer. Next, the negative mask was adhered to the coating and the photosensitive layer was exposed in an exposure amount of 100 mJ/cm$^2$ using a direct-write exposure machine (product name: EDi-5008, commercially available from Orc Manufacturing Co., Ltd.). Then, spray developing was performed in a 1 mass % sodium carbonate aqueous solution for 60 seconds at a pressure of $1.765 \times 10^5$ Pa and an unexposed part was dissolved and developed. Next, exposure was performed in an exposure amount of 1000 mJ/cm² using an ultraviolet ray exposure device, and heating was performed at 150° C. for 1 hour, and thereby a test piece having a permanent mask resist on the copper foil was produced. The surface of the obtained test piece on which the permanent mask resist was provided and the copper-clad laminate (MCL-E-67, commercially available from Hitachi Chemical Company) were cured and adhered using an adhesive (product name: Araldite, commercially available from Nichiban Co., Ltd.).

After being left for 12 hours, 10 mm of one end of the copper foil was peeled off. Next, the laminate was fixed, the peeled off copper foil was picked with a grasping tool, a load (peel strength) when the copper foil was peeled off in the thickness direction (vertical direction) at a tensile speed of 50 mml/min and room temperature was measured 8 times, and an average value of 8 measurement values was calculated and used as an index of the adhesive strength. Here, the peel strength was evaluated according to JIS C 5016 (peeling strength of 1994-conductor) and evaluation was performed according to the following criteria. In addition, in this specification, room temperature indicates 25° C.
A: The peel strength was larger than 0.5 kN/mm.
B: The peel strength was in a range of 0.3 to 0.5 kN/mm.
C: The peel strength was less than 0.3 kN/mm.
[Insulation (Electrical Insulation)]

A test piece was formed in the same method as in the above [test piece producing method II] except that a bismaleimide triazine substrate in which an interdigitated array electrode (line/space=10 μm/10 μm) was formed was used in place of the copper-clad laminate substrate, and exposed under conditions of 135° C., 85%, and 5 V. Then, the degree of occurrence of migration was observed under a metal microscope at a magnification of 100, and evaluation was performed according to the following criteria.
A: Even after 200 hours, no migration occurred in the permanent mask resist, and the resistance value did not fall below $10^{-6}\Omega$ or less.
B: In 100 hours or longer and shorter than 200 hours, no migration occurred in the permanent mask resist and the resistance value did not fall below $10^{-6}\Omega$ or less.
C: In shorter than 100 hours, migration occurred in the permanent mask resist, and the resistance value decreased to $10^{-6}\Omega$ or less.
[Solder Heat Resistance]

A water-soluble flux was applied to a test piece produced in the same method as in the above [test piece producing method II] and immersed in a solder bath at 265° C. for 10 seconds. These procedures were set as one cycle, and 6 cycles were repeated, and the appearance of the permanent mask resist was then visually observed, and evaluated according to the following criteria.
3: There was no change in appearance within the 30 cm×30 cm permanent mask resist.
2: There were 1 to 5 floatings or blisters on the coating within the 30 cm×30 cm permanent mask resist.
1: There were 6 or more floatings or blisters on the coating within the 30 cm×30 cm permanent mask resist.
[Crack Resistance]

Treatments at −65° C. for 30 minutes/(room temperature; 25° C.)/150° C. for 30 minutes were set as one cycle, and 1000 cycles were repeated on a test piece produced in the same method as in the above [test piece producing method II], and the appearance of the permanent mask resist was then visually observed, and evaluated according to the following criteria.
3: There was no change in appearance within the 30 cm×30 cm permanent mask resist.
2: There were 1 to 5 floatings or blisters on the coating within the 30 cm×30 cm permanent mask resist.
1: There were 6 or more floatings or blisters on the coating within the 30 cm×30 cm permanent mask resist.
[Solvent Resistance]

A test piece produced in the same method as in the above [test piece producing method II] was immersed in isopropyl alcohol at room temperature (25° C., hereinafter the same) for 30 minutes, and it was confirmed that there was no abnormality in the appearance in the permanent mask resist, and a peeling test was then performed using a cellophane tape.
3: There was no abnormality in the appearance of the permanent mask resist and no peeling occurred.
2: There was a slight change in the appearance of the permanent mask resist.
1: There was abnormality in the appearance of the permanent mask resist or peeling occurred.
[Acid Resistance]

A test piece produced in the same method as in the above [test piece producing method II] was immersed in a 10 mass % hydrochloric acid aqueous solution at room temperature for 30 minutes, it was confirmed that there was no abnormality in the appearance of the permanent mask resist, and a peeling test was then performed using a cellophane tape.
3: There was no abnormality in the appearance of the permanent mask resist and no peeling occurred.
2: There was a slight change in the appearance of the permanent mask resist.
1: There was abnormality in the appearance of the permanent mask resist or peeling occurred.
[Alkali Resistance]

A test piece produced in the same method as in the above [test piece producing method II] was immersed in a 5 mass % sodium hydroxide aqueous solution at room temperature for 30 minutes, it was confirmed that there was no abnormality in the appearance in the permanent mask resist, and a peeling test was then performed using a cellophane tape.
3: There was no abnormality in the appearance of the permanent mask resist and no peeling occurred.
2: There was a slight change in the appearance of the permanent mask resist.
1: There was abnormality in the appearance of the permanent mask resist or peeling occurred.

TABLE 2

| Characteristics | Examples | | | | | | | | | Comparative Examples | | | | |
| --- | --- | --- | --- | --- | --- | --- | --- | --- | --- | --- | --- | --- | --- | --- |
| | 1 | 2 | 3 | 4 | 5 | 6 | 7 | 8 | 9 | 1 | 2 | 3 | 4 | 5 |
| Resolution I | A | A | A | A | A | A | A | A | A | A | A | A | A | A |
| Resolution II | A | A | A | A | A | A | A | A | A | B | B | B | B | B |
| Adhesion | A | A | A | A | A | A | A | A | A | C | C | C | C | C |
| Insulation | A | A | A | A | A | A | A | A | A | C | C | C | C | C |

TABLE 2-continued

|  | Examples | | | | | | | | | Comparative Examples | | | | |
| --- | --- | --- | --- | --- | --- | --- | --- | --- | --- | --- | --- | --- | --- | --- |
| Characteristics | 1 | 2 | 3 | 4 | 5 | 6 | 7 | 8 | 9 | 1 | 2 | 3 | 4 | 5 |
| Solder heat resistance | 3 | 3 | 3 | 3 | 3 | 3 | 3 | 3 | 3 | 1 | 1 | 1 | 1 | 1 |
| Crack resistance | 3 | 3 | 3 | 3 | 3 | 3 | 3 | 3 | 3 | 1 | 1 | 1 | 1 | 1 |
| Solvent resistance | 3 | 3 | 3 | 3 | 3 | 3 | 3 | 3 | 3 | 1 | 1 | 1 | 1 | 1 |
| Acid resistance | 3 | 3 | 3 | 3 | 3 | 3 | 3 | 3 | 3 | 1 | 1 | 1 | 1 | 1 |
| Alkali resistance | 3 | 3 | 3 | 3 | 3 | 3 | 3 | 3 | 3 | 1 | 1 | 1 | 1 | 1 |

As shown in Table 2, in the photosensitive resin compositions of the present embodiment of Examples 1 to 9 using a benzophenone compound as a photopolymerization sensitizer, even if either a projection type exposure device or a direct-write exposure device was used, it was possible to form the resist patterns having an excellent resist shape (resolution) at the same amount of exposure without adjustment of the composition. In addition, it was found that the formed resist patterns had excellent adhesion and insulation, and additionally, they were evaluated as being excellent as "3" in the evaluations of the solder heat resistance, crack resistance, solvent resistance, acid resistance and alkali resistance. Therefore, particularly, the photosensitive resin composition of the present embodiment was able to be suitably used for producing a permanent mask resist, and also exhibited excellent characteristics without the need for fine adjustment of the composition regardless of which of a projection type exposure device and a direct-write exposure device was used. On the other hand, in the photosensitive resin compositions of Comparative Examples 1 to 5 containing no benzophenone compound, when a projection type exposure device was used, the resist shape (resolution) exhibited the same performance as the example, but when a direct-write exposure device was used in the same amount of exposure, effects of all characteristics including the resist shape (resolution) were inferior.

Examples 9 to 18 and Comparative Examples 6 to 10

The photosensitive resin compositions of Examples 1 to 9 and Comparative Examples 1 to 5 prepared according to formulation proportions shown in Table 1 were diluted in methyl ethyl ketone and applied to polyethylene terephthalate (PET) films with a thickness of 25 μm, and dried at 90° C. for 10 minutes to form photosensitive layers made of the photosensitive resin composition and having a thickness of 25 μm. In addition, a cover film (a polypropylene film with a thickness of 15 μm) was laminated thereon and thereby dry films of Examples 9 to 18 and Comparative Examples 6 to 10 were produced.

[Evaluation of Dry Film]

The cover film was peeled off from the dry film obtained above, the dry film was thermally laminated (75° C., 0.4 MPa) on a solid copper foil substrate, and next, exposure was performed in the same method as in the above [test piece production], and thereby a test piece having a permanent mask resist was produced. Evaluation was performed in the same manner as in Example 1 using the obtained test piece. The results are shown in Table 3.

TABLE 3

|  | Examples | | | | | | | | | Comparative Examples | | | | |
| --- | --- | --- | --- | --- | --- | --- | --- | --- | --- | --- | --- | --- | --- | --- |
| Characterislics | 10 | 11 | 12 | 13 | 14 | 15 | 16 | 17 | 18 | 6 | 7 | 8 | 9 | 10 |
| Resolution I | A | A | A | A | A | A | A | A | A | A | A | A | A | A |
| Resolution II | A | A | A | A | A | A | A | A | A | B | B | B | B | B |
| Adhesion | A | A | A | A | A | A | A | A | A | C | C | C | C | C |
| Insulation | A | A | A | A | A | A | A | A | A | C | C | C | C | C |
| Solder heat resistance | 3 | 3 | 3 | 3 | 3 | 3 | 3 | 3 | 3 | 1 | 1 | 1 | 1 | 1 |
| Crack resistance | 3 | 3 | 3 | 3 | 3 | 3 | 3 | 3 | 3 | 1 | 1 | 1 | 1 | 1 |
| Solvent resistance | 3 | 3 | 3 | 3 | 3 | 3 | 3 | 3 | 3 | 1 | 1 | 1 | 1 | 1 |
| Acid resistance | 3 | 3 | 3 | 3 | 3 | 3 | 3 | 3 | 3 | 1 | 1 | 1 | 1 | 1 |
| Alkali resistance | 3 | 3 | 3 | 3 | 3 | 3 | 3 | 3 | 3 | 1 | 1 | 1 | 1 | 1 |

As shown in Table 3, in the dry films of the present embodiment of Examples 10 to 18 using a benzophenone compound as a photopolymerization sensitizer, even if either a projection type exposure device or a direct-write exposure device was used, it was possible to form the resist patterns having an excellent resist shape (resolution) at the same amount of exposure without adjustment of the composition. In addition, it was found that the formed resist patterns had excellent adhesion and insulation, and additionally, they were evaluated as being excellent as "3" in the evaluations of the solder heat resistance, crack resistance, solvent resistance, acid resistance and alkali resistance. Therefore, particularly, the dry film of the present embodiment was able to be suitably used for producing a permanent mask resist, and also exhibited excellent characteristics without the need for fine adjustment of the composition regardless of which of a projection type exposure device and a direct-write exposure device was used. On the other hand, in the dry films of Comparative Examples 6 to 10 containing no benzophenone compound, when a projection type exposure device was used, the resist shape (resolution) exhibited the same performance as the example, but when a direct-write exposure device was used in the same amount of exposure, effects of all characteristics including the resist shape (resolution) were inferior.

The invention claimed is:

1. A photosensitive resin composition comprising:
an acid-modified vinyl group-containing epoxy resin (A);
a photopolymerization initiator (B);
a photopolymerization sensitizer containing a benzophenone compound (C); and
a photopolymerizable compound (D), wherein
the acid-modified vinyl group-containing epoxy resin (A) comprises at least one acid-modified vinyl group-containing epoxy resin (A1) synthesized using a bisphenol novolak type epoxy resin (a1) and at least one acid-modified vinyl group-containing epoxy resin (A2) synthesized using an epoxy resin (a2) different from the epoxy resin (a1), and
the acid-modified vinyl group-containing epoxy resin (A1) is a resin obtained by reacting a resin (A1') obtained by reacting the epoxy resin (a1) with a vinyl group-containing monocarboxylic acid (b) with a saturated or unsaturated group-containing polybasic acid anhydride (c), and the acid-modified vinyl group-containing epoxy resin (A2) is a resin obtained by reacting a resin (A2') obtained by reacting each of the epoxy resins (a2) with a vinyl group-containing monocarboxylic acid (b) with a saturated or unsaturated group-containing polybasic acid anhydride (c);
wherein the epoxy resin (a2) is at least one selected from the group consisting of a novolak type epoxy resin, a bisphenol A type epoxy resin, a bisphenol F type epoxy resin, and a triphenolmethane type epoxy resin.

2. The photosensitive resin composition according to claim 1, wherein the benzophenone compound contained in the component (C) is a benzophenone compound having at least one group selected from the group consisting of an amino group, an ethylamino group, a dimethylamino group, a diethylamino group, a dibutylamino group, a hydroxyl group, a methoxy group, an ethoxy group, a butoxy group, and a phenyl group.

3. The photosensitive resin composition according to claim 1, wherein the bisphenol novolak type epoxy resin (a1) is at least one selected from the group consisting of bisphenol novolak type epoxy resins having a structural unit represented by the following General Formula (I) and bisphenol novolak type epoxy resins having a structural unit represented by the following General Formula (II):

[Chem. 1]

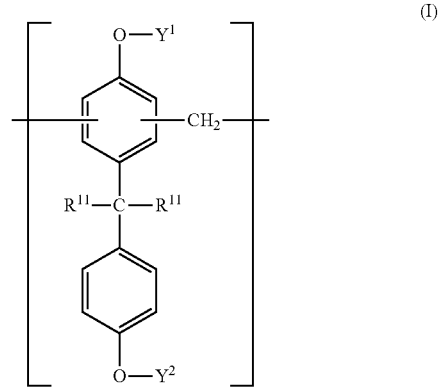

[in General Formula (I), $R^{11}$ represents a hydrogen atom or a methyl group, $Y^1$ and $Y^2$ each independently represent a hydrogen atom or a glycidyl group, a plurality of may be the same as or different from each other, and at least one of $Y^1$ and $Y^2$ represents a glycidyl group]

[Chem. 2]

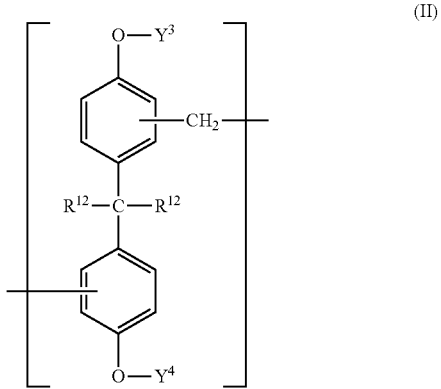

[in General Formula (II), $R^{12}$ represents a hydrogen atom or a methyl group, $Y^3$ and $Y^4$ each independently represent a hydrogen atom or a glycidyl group, a plurality of $R^{12}$'s may be the same as or different from each other, and at least one of $Y^3$ and $Y^4$ represents a glycidyl group], and the epoxy resin (a2) is at least one selected from the group consisting of a novolak type epoxy resin having a structural unit represented by the following General Formula (III), a bisphenol type epoxy resin having a structural unit represented by the following General Formula (IV), and a triphenolmethane type epoxy resin having a structural unit represented by the following General Formula (V):

[Chem. 3]

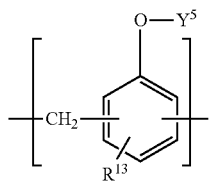
(III)

[in General Formula (III), $R^{13}$ represents a hydrogen atom or a methyl group, $Y^5$ represents a hydrogen atom or a glycidyl group, and a molar ratio between hydrogen atoms and glycidyl groups (hydrogen atoms/glycidyl groups) is 0/100 to 30/70]

[Chem. 4]

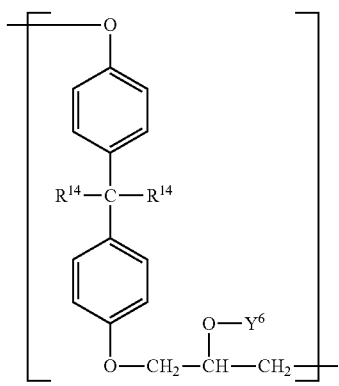
(IV)

[in General Formula (IV), $R^{14}$ represents a hydrogen atom or a methyl group, $Y^6$ represents a hydrogen atom or a glycidyl group, a molar ratio between hydrogen atoms and glycidyl groups (hydrogen atoms/glycidyl groups) is 0/100 to 30/70, and a plurality of $R^{14}$'s may be the same as or different from each other]

[Chem. 5]

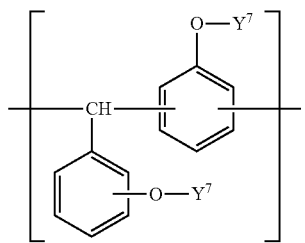
(V)

[in General Formula (V), $Y^7$ represents a hydrogen atom or a glycidyl group, a plurality of $Y^7$'s may be the same as or different from each other, and at least one is a glycidyl group].

4. The photosensitive resin composition according to claim 3, wherein the bisphenol novolak type epoxy resin (a1) has a structural unit represented by General Formula (I) and the epoxy resin (a2) is a bisphenol A type epoxy resin or bisphenol F type epoxy resin having a structural unit represented by General Formula (IV).

5. The photosensitive resin composition according to claim 3, wherein the epoxy resin (a2) is a novolak type epoxy resin having a structural unit represented by General Formula (III).

6. The photosensitive resin composition according to claim 1, wherein the photopolymerization initiator (B) is at least one selected from the group consisting of an alkylphenone photopolymerization initiator, an acylphosphine oxide photopolymerization initiator, a titanocene photopolymerization initiator, and an oxime ester photopolymerization initiator.

7. The photosensitive resin composition according to claim 1, wherein the photopolymerization initiator (B) is at least one selected from the group consisting of an alkylphenone photopolymerization initiator, an acylphosphine oxide photopolymerization initiator, and an oxime ester photopolymerization initiator.

8. The photosensitive resin composition according to claim 1, wherein the photopolymerization initiator (B) is an acylphosphine oxide photopolymerization initiator.

9. The photosensitive resin composition according to claim 1, further comprising a pigment (E).

10. The photosensitive resin composition according to claim 1, further comprising an inorganic filler (F).

11. A dry film comprising:
a carrier film; and
a photosensitive layer using the photosensitive resin composition according to claim 1.

12. A printed wiring board comprising a permanent mask resist formed of the photosensitive resin composition according to claim 1.

13. The printed wiring board according to claim 12, wherein the thickness of the permanent mask resist is 10 μm or more.

14. A printed wiring board manufacturing method, comprising:
a process of providing a photosensitive layer on a substrate using the photosensitive resin composition according to claim 1;
a process of forming a resist pattern using the photosensitive layer; and
a process of curing the resist pattern to form a permanent mask resist, in this order.

15. A printed wiring board manufacturing method, comprising:
a process of providing a photosensitive layer on a substrate using the dry film according to claim 11;
a process of forming a resist pattern using the photosensitive layer; and
a process of curing the resist pattern to form a permanent mask resist, in this order.

* * * * *

UNITED STATES PATENT AND TRADEMARK OFFICE
CERTIFICATE OF CORRECTION

| | | |
|---|---|---|
| PATENT NO. | : 11,921,424 B2 | |
| APPLICATION NO. | : 16/497600 | |
| DATED | : March 5, 2024 | |
| INVENTOR(S) | : Nobuhito Komuro, Yuta Daijima and Masayuki Kojima | |

It is certified that error appears in the above-identified patent and that said Letters Patent is hereby corrected as shown below:

On The Title Page

Assignee item (73) Line (1) delete "HITACHI CHEMICAL COMPANY, LTD. (FIPAS)" and insert
-- RESONAC CORPORATION --

Signed and Sealed this
Twenty-fourth Day of September, 2024

Katherine Kelly Vidal
*Director of the United States Patent and Trademark Office*